United States Patent
Kaiho et al.

(10) Patent No.: US 8,649,537 B2
(45) Date of Patent: Feb. 11, 2014

(54) DRIVE DEVICE

(75) Inventors: Toshio Kaiho, Tokyo (JP); Hidenobu Takeshita, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 335 days.

(21) Appl. No.: 12/999,845

(22) PCT Filed: Jul. 16, 2010

(86) PCT No.: PCT/JP2010/004623
§ 371 (c)(1),
(2), (4) Date: Dec. 17, 2010

(87) PCT Pub. No.: WO2011/010443
PCT Pub. Date: Jan. 27, 2011

(65) Prior Publication Data
US 2011/0235831 A1  Sep. 29, 2011

(30) Foreign Application Priority Data

Jul. 24, 2009 (JP) .................. 2009-173307
Jul. 24, 2009 (JP) .................. 2009-173308

(51) Int. Cl.
*H04R 17/00* (2006.01)
*H03F 3/217* (2006.01)

(52) U.S. Cl.
USPC ............ 381/190; 381/174; 327/108; 327/122

(58) Field of Classification Search
USPC ..................... 381/98, 120; 327/111; 341/135; 310/316.03
See application file for complete search history.

(56) References Cited

U.S. PATENT DOCUMENTS

| 2004/0145273 A1* | 7/2004 | Khoury et al. ........... 310/316.03 |
| 2007/0079710 A1* | 4/2007 | Ishizaki ....................... 101/189 |
| 2007/0290726 A1* | 12/2007 | Kaiho et al. .................. 327/111 |
| 2008/0106447 A1* | 5/2008 | Zare-Hoseini et al. ....... 341/135 |

FOREIGN PATENT DOCUMENTS

| JP | 2005-210280 | 8/2005 |
| JP | 2007-96364 | 4/2007 |
| WO | WO 2007/132839 | 11/2007 |
| WO | WO 2011/010443 A1 | 1/2011 |

* cited by examiner

*Primary Examiner* — Duc Nguyen
*Assistant Examiner* — Phan Le
(74) *Attorney, Agent, or Firm* — Morgan, Lewis & Bockius LLP

(57) ABSTRACT

There is provided a drive device capable of driving a capacitive load with efficiency and with low power consumption while keeping quality input reproducibility for output signal. A switching drive circuit 10f repeatedly performs operations in the order of VCP charging phase PH_VCP_CH, VCP discharging phase PH_VCP_dCH, VCN charging phase PH_VCN_CH, and VCN discharging phase PH_VCN_dCH. A switching amplifier 10 allows a charging phase per cycle for an input signal VIN that is a reference for operation to be either a phase in which the slope of the input signal VIN is positive from a reference voltage REFL or greater until a maximum voltage, or a phase in which the slope of the input signal VIN is negative from a reference voltage REFH or less until a minimum voltage.

17 Claims, 15 Drawing Sheets

F I G. 4
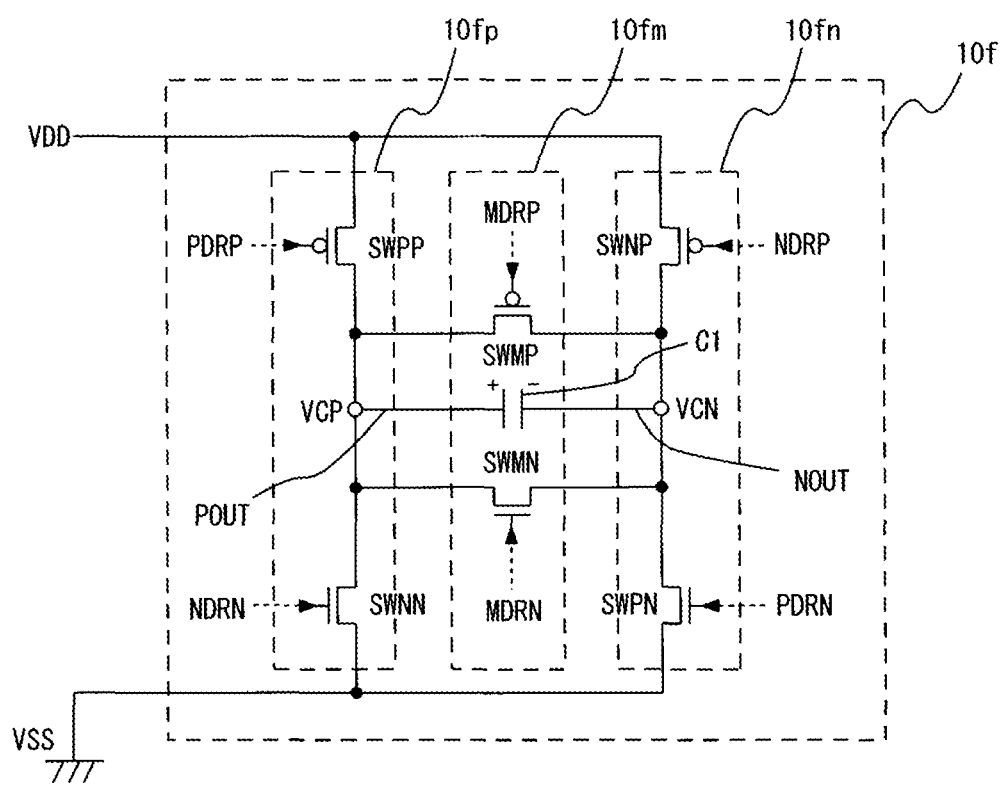

F I G. 1 1
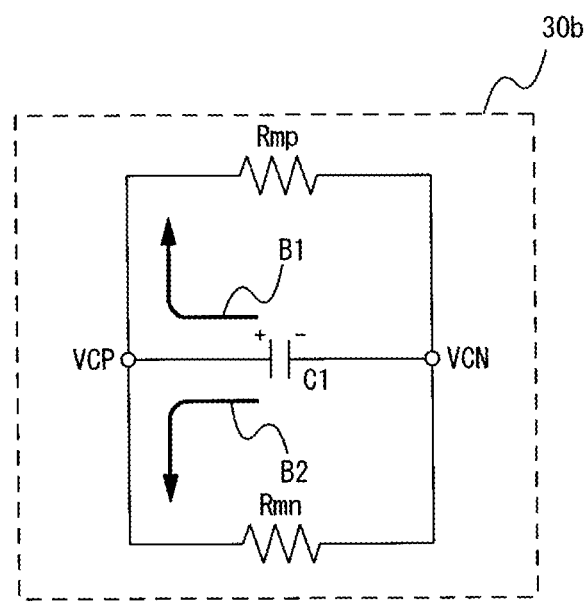

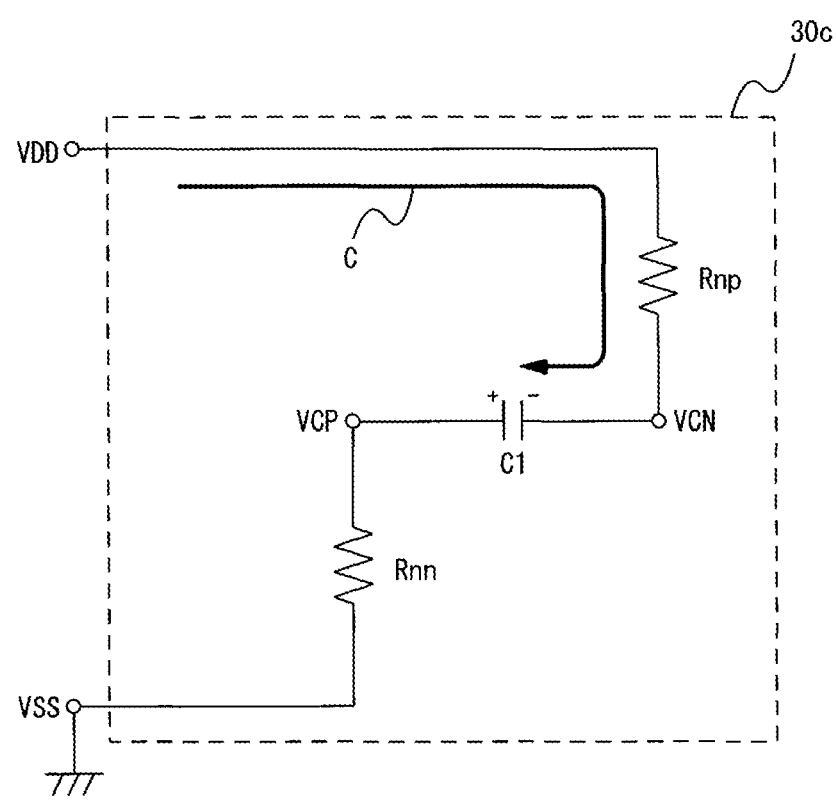
F I G. 12

DRIVE DEVICE

TECHNICAL FIELD

The present invention relates to a drive device, and in particular, to a drive device used for driving a capacitive load.

Background Art

In recent years, downsizing and development of low power consumption of mobile phones, personal digital assistance devices, and mobile devices such as portable music players has been advancing rapidly.

As a familiar example, mobile telephones that are a very slim in design and are lightweight are desired by users. At the same time, while products with high functionality are increasing, those allowing long-time drive with low power consumption are desirable.

Naturally, there is the need for downsizing and development of low power consumption of components built into these devices. These days mobile telephones come to use piezoelectric speakers that are relatively easily downsized and have low power consumption.

Meanwhile, such mobile devices are usually driven by a battery as a power source, so it is desirable that they can be driven as long as possible. Accordingly, a class D amplifier is often employed for a drive device for driving a capacitive load such as a piezoelectric speaker, since it is relatively power efficient. With this class D amplifier, charging time for the capacitive load is determined according to the duty ratio of pulse signal waves obtained through Pulse Width Modulation (PWM), for example.

For example, the drive device, the drive method, and the information device disclosed in Patent Document 1: WO2007132839 are provided for detecting an amplitude error occurring between two differential output signals through feedback control of feeding back the differential output signals. The PWM circuit changes pulse width (duty ratio) of the pulse signal waves based on the detected amplitude error, and changes the ratio of phase of supplying power to that of not supplying power. As a result, a high quality output signal with less amplitude error may be provided by the drive device, while also reducing the reactive power of the drive device.

PRIOR ART DOCUMENT

Patent Document

Patent Document 1: WO 2007132839

SUMMARY OF INVENTION

Problem To Be Solved By Invention

With a typical class D amplifier, however, a capacitive load is firstly charged from its own positive electrode in the positive slope of an input signal. Then, the capacitive load is charged from its own negative electrode in the negative slope of the input signal. In other words, in order to drive the capacitive load, charging is necessary in all periods throughout one cycle of the input signal.

The present invention has been made in view of the aforementioned problem and has an object to provide a drive device capable of driving a capacitive load in an efficient manner with low power consumption while keeping quality input reproducibility for output signal.

Solution to the Problem

In order to achieve the aforementioned objective, the drive device according to the present invention is configured in the following manner.

There is provided a drive device, according to a first aspect of the present invention, for performing a pulse modulation of an input signal and outputting an output signal for driving a capacitive load; the drive device comprising: switching driver for including a charging switching element for charging the capacitive load and a short-circuiting switching element for short-circuiting between both terminals of the capacitive load to discharge the capacitive load, and operating the charging switching element and the short-circuiting switching element to output the output signal; and driving controller for controlling the switching driver based on the pulse-modulated input signal so as to repeatedly perform a charging phase that alternately repeats a phase charging the capacitive load and a phase not charging the capacitive load, and a discharging phase that alternately repeats a phase discharging the capacitive load and a phase not discharging the capacitive load, wherein the driving controller controls so as to change over from the charging phase to the discharging phase or from the discharging phase to the charging phase when a slope of the input signal changes.

In the above drive device according to the first aspect of the present invention, the driving controller changes over the charging phase and the discharging phase alternately according to slope of the input signal. In this discharging phase, the switching driver short-circuits between both terminals of the capacitive load so as to substantially bring the capacitive load into a state of being cut off from a direct current power supply voltage and a reference voltage. This results in discharging of the capacitive load in the discharging phase, so that the capacitive load is not charged. The provision of such a discharging phase does not always cause the charging phase in which the capacitive load is charged, thereby allowing driving of the capacitive load efficiently with low power consumption.

In the drive circuit according to a second aspect of the present invention, the driving controller controls such that the discharging phase is changed to the charging phase either when the slope of the input signal is positive and the input signal reaches a first reference voltage, which is lower than an operation reference voltage of the input signal, or the slope of the input signal is negative and the input signal reaches a second reference voltage, which is higher than the operation reference voltage of the input signal.

In the above drive circuit according to the second aspect of the present invention, the driving controller changes over from the discharging phase to the charging phase either when the slope of the input signal is positive and the input signal reaches the first reference voltage, or the slope of the input signal is negative and the input signal reaches the second reference voltage. In this manner, by not changing over from the discharging phase to the charging phase when the input signal reaches the operation reference voltage with reference to not only the slope of the input signal but also the voltage level thereof, zero-cross distortion of the output signal may be reduced and an output signal with quality reproducibility of the input signal may be obtained.

In the drive circuit according to a third aspect of the present invention, the charging phase includes a first charging phase in which the capacitive load is charged from a positive terminal of the capacitive load and a second charging phase in which the capacitive load is charged from a negative terminal of the capacitive load, the discharging phase includes a first discharging phase in which the capacitive load is discharged from the positive terminal of the capacitive load and a second discharging phase in which the capacitive load is discharged from the negative terminal of the capacitive load, and the driving controller controls change to the first charging phase, when the input signal reaches the first reference voltage in a positive slope of the input signal, controls change to the first discharging phase, when the slope of the input signal changes from positive to negative, controls change to the second charging phase, when the input signal reaches the second reference voltage in a negative slope of the input signal, and controls change to the second discharging phase, when the slope of the input signal changes from negative to positive.

In the above drive device according to the third aspect of the present invention, the driving controller changes over to each of a first charging phase, a second charging phase, a first discharging phase, and a second discharging phase according to slope and voltage level of the input signal. Namely, since there are two charging phases and two discharging phases in one cycle of the input signal, charging the capacitive load and discharging the capacitive load may be conducted carefully, and the capacitive load may be driven efficiently with low power consumption.

In the drive circuit according to a fourth aspect of the present invention, the charging switching element comprises: a first switching element connected between the positive terminal of the capacitive load and the supply voltage; a second switching element connected between the positive terminal of the capacitive load and a reference voltage; a third switching element connected between the negative terminal of the capacitive load and the supply voltage; and a fourth switching element connected between the negative terminal of the capacitive load and the reference voltage, and wherein the shorting switching element comprises: a fifth and a sixth switching element connected between both terminals of the capacitive load; and wherein the driving controller turns on the first and the fourth switching elements of the first to the sixth switching elements in the first charging phase, turns on the second and the third switching elements of the first to the sixth switching elements in the second charging phase, turns on the fifth and the sixth switching elements of the first to the sixth switching elements in the first and the second discharging phases, and turns off the first to the sixth switching elements in the phase not charging the capacitive load and in the phase not discharging the capacitive load.

In the above drive device according to the fourth aspect of the present invention, the driving controller may carry out each of the aforementioned first charging phase, the second charging phase, the first discharging phase, and the second discharging phase by controlling an on and off operation of the first to sixth switching elements.

In the drive device according to a fifth aspect of the present invention, a bias voltage is applied to the output signal.

In the above drive device according to the fifth aspect of the present invention, a distortion in output signal waveforms may be prevented by application of the bias voltage to the output signal, thereby allowing the stabilization of the output signal waveforms.

In the drive device according to a sixth aspect of the present invention, the bias voltage is lower than the supply voltage.

In the above drive device according to the sixth aspect of the present invention, the bias voltage may take any voltage as far as it is lower than the supply voltage and the effect resulting from applying the bias voltage described above is obtainable.

In the drive circuit according to a seventh aspect of the present invention, the bias voltage is approximately a half of the supply voltage.

In the above drive circuit according to the seventh aspect of the present invention, the bias voltage may be approximately a half of the supply voltage and the effect resulting from applying the bias voltage described above is obtainable.

In the drive device according to an eighth aspect of the present invention, the bias voltage is applied in at least the discharging phase.

In the above drive device according to the eighth aspect of the present invention, the bias voltage is applied to the output signal in the discharging phase. As described above, in the discharging phase, the capacitive load is short-circuited, namely it is effectively cut off from a direct current supply voltage and a reference voltage. As a result, the terminal voltages of the capacitive load easily shift toward the reference voltage. This easily generates a distortion in the output signal waveforms. Therefore, the generation of a distortion in the output signal waveforms may be prevented by applying the bias voltage to the output signal in the discharging phase, so as to stabilize the output signal waveforms.

The drive device according a ninth aspect of to the present invention further includes a bias voltage output unit that applies the bias voltage to at least one of the terminals of the capacitive load.

In the above drive device according the ninth aspect of to the present invention, if the bias voltage output unit applies the bias voltage to at least one of the terminals of the capacitive load, the same effect as that of the aforementioned drive device may be achieved.

In the drive device according to a tenth aspect of the present invention, the supply voltage is a direct-current supply voltage resulting from boosting and outputting a direct-current voltage.

In the above drive device according to the tenth aspect of the present invention, even when a capacitive load is driven by a direct current battery of a small appliance as an electric power supply, it is possible to obtain an output signal with quality reproducibility of the input signal and drive the capacitive load with low power consumption.

The drive device according to an eleventh aspect of the present invention, further includes a feedback unit comprising a low-pass filter circuit for removing high-frequency components of the output signal, a differential single-ended signal conversion circuit for converting the output signal output from the low-pass filter circuit from a differential signal type to a single-ended signal type, and a signal correction circuit for correcting an amplitude of the output signal based on an amplitude error between the output signal of the single-ended signal that is converted by the differential single-ended signal conversion circuit and the input signal; and a pulse modulation unit for performing the pulse modulation to the input signal based on a signal from the signal correction circuit.

In the above drive device according to the eleventh aspect of the present invention, each of the principal parts of the driving controller, the switching driver, and the feedback unit may be configured using the same parts as a typical drive device.

In the drive device according to a twelfth aspect of the present invention, the capacitive load is a piezoelectric speaker device.

In the above drive device according to the twelfth aspect of the present invention, even when a piezoelectric speaker mounted on a small appliance or the like is driven, it is possible to obtain an output signal with quality reproducibility of the input signal and drive the piezoelectric speaker with low power consumption.

There is provided a driving method, according to a first method of the present invention, of performing a pulse modulation of an input signal and driving a capacitive load, the driving method comprising: repeatedly performing a charging phase that alternately repeats a phase charging the capacitive load and a phase not charging the capacitive load, and a discharging phase that alternately repeats a phase discharging the capacitive load and a phase not discharging the capacitive load, based on the input signal, and changing over from the charging phase to the discharging phase or from the discharging phase to the charging phase, when a slope of the input signal changes.

In the above driving method according to the first method of the present invention, the same action as that of the drive device according to the first aspect of the present invention may be achieved.

The driving method according to a second method of the present invention further includes changing from the discharging phase to the charging phase, when the slope of the input signal is positive and the input signal reaches a first reference voltage which is lower than an operation reference voltage of the input signal, and when slope of the input signal is negative and the input signal reaches a second reference voltage which is higher than the operation reference voltage of the input signal.

In the above driving method according to the second method of the present invention, the same action as that of the drive device according to the second aspect of the present invention may be achieved.

In the driving method according to a third method of the present invention, the charging phase includes a first charging phase in which the capacitive load is charged from a positive terminal of the capacitive load and a second charging phase in which the capacitive load is charged from a negative terminal of the capacitive load, the discharging phase includes a first discharging phase in which the capacitive load is discharged from the positive electrode of the capacitive load and a second discharging phase in which the capacitive load is discharged from the negative electrode of the capacitive load, change is made to the first charging phase, when the input signal reaches the first reference voltage in the positive slope of the input signal, change is made to the first discharging phase, when the slope of the input signal changes from positive to negative, change is made to the second charging phase, when the input signal reaches the second reference voltage in a negative slope of the input signal, and change is made to the second discharging phase, when the slope of the input signal changes from negative to positive.

In the above driving method according to the third method of the present invention, the same action as that of the drive device according to the third aspect of the present invention may be achieved.

In the driving method according to a fourth method of the present invention, a bias voltage is applied to the output signal.

In the above driving method according to the fourth method of the present invention, the same action as that of the drive device according to the fifth aspect of the present invention may be achieved.

In the driving method according to a fifth method of the present invention, the capacitive load is a piezoelectric speaker device.

In the above driving method according to the fifth method of the present invention, the same action as that of the drive device according to the twelfth aspect of the present invention may be achieved.

Advantageous Effects of Invention

According to the drive device of the present invention, in the discharging phase where the switching driver discharges the capacitive load, the capacitive load is short-circuited, in fact, the capacitive load is effectively cut off from the supply voltage and the reference voltage.

Meanwhile, charging phases per cycle may be reduced to a period from the time when the input signal reaches the first reference voltage or greater until the time when a maximum voltage with positive slope of the input signal, and a period from the time when the input signal reaches the second reference voltage or less until the time when a minimum voltage with negative slope. As a result, since the charging phases per cycle may be reduced to approximately a half thereof, the capacitive load may be driven efficiently with low power consumption.

Moreover, since the drive device according to the present invention changes over from the discharging phase to the charging phase when the input signal reaches the first reference voltage or the second reference voltage that is not the operation reference voltage, zero-cross distortion may be reduced, and the capacitive load may be driven effectively with low power consumption while keeping quality input reproducibility for output signal.

At the same time, even when the capacitive load is short-circuited in the discharging phase, namely when it is effectively cut off from a direct current supply voltage and a reference voltage, the drive device according to the present invention may prevent a distortion in the output waveforms of the output signals occurring due to being cut off from the supply voltage and the reference voltage by the bias voltage output unit applying the bias voltage to the output signals so as to stabilize the output signal waveforms.

BRIEF DESCRIPTION OF DRAWINGS

FIG. 4 is a block diagram illustrative of a configuration of a switching drive circuit 10f;

FIG. 11 is a circuit diagram illustrative of an equivalent circuit in a VCP discharging phase of the switching drive circuit 10f;

FIG. 12 is a circuit diagram illustrative of an equivalent circuit in a VCN charging phase of the switching drive circuit 10f;

DESCRIPTION OF EMBODIMENTS

Figure 1:
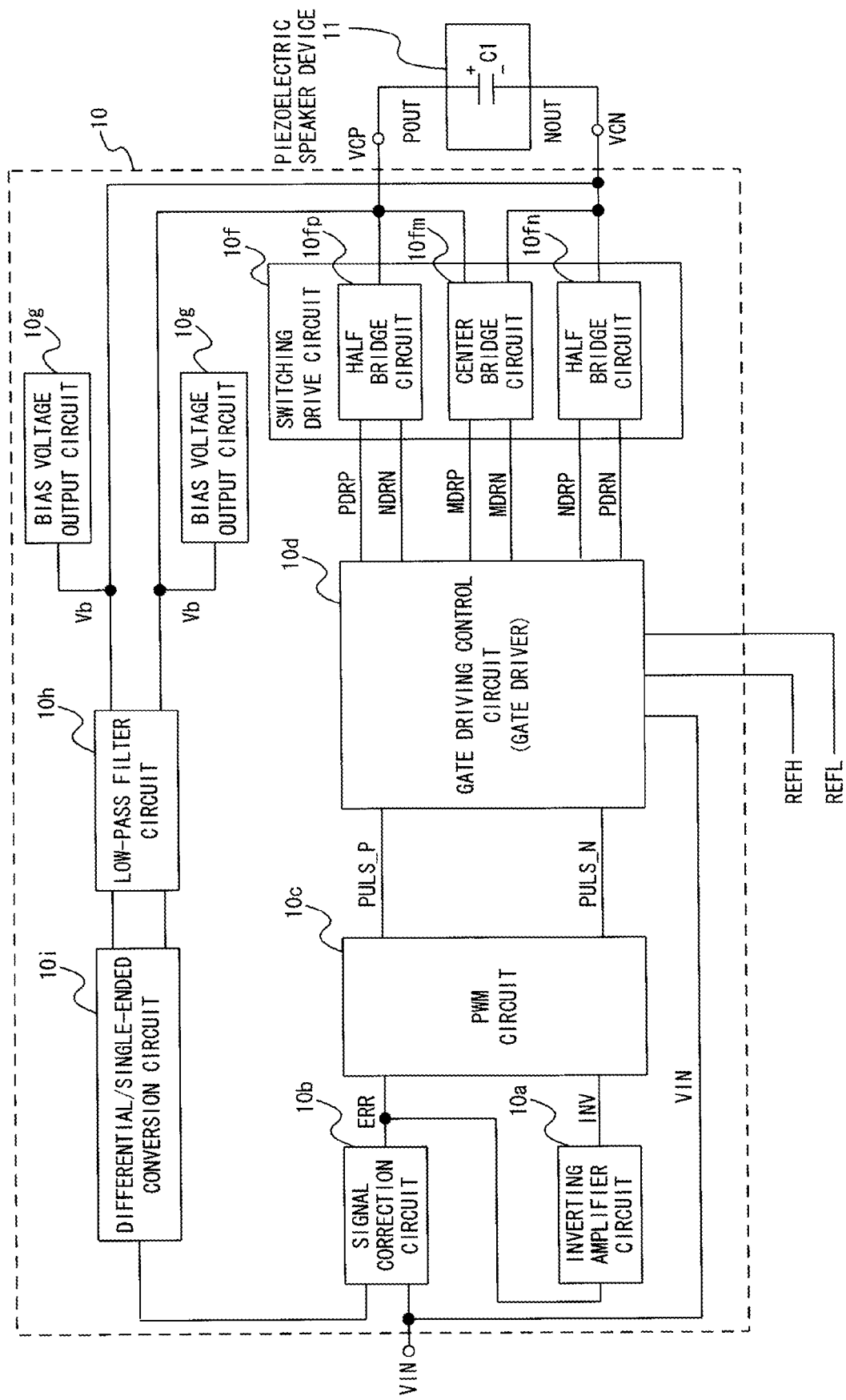
FIG. 1 is a block diagram illustrative of a configuration of a switching amplifier 10 as an illustrative example of a drive device according to the present invention.

Hereinafter, the present invention will be described based on the accompanied drawings. It is to be noted that the same components as in other drawings are indicated by the same reference numerals in the respective drawings referenced in the following description.
(Configuration of Switching Amplifier 10)

Firstly, a configuration of a switching amplifier 10, which drives a piezoelectric speaker device 11 as a capacitive load C1 will be described as an exemplary drive device of the present invention with reference to FIG. 1. FIG. 1 is a block diagram illustrative of a configuration of the switching amplifier 10 as an illustrative example of the drive device of the present invention.

The switching amplifier 10 illustrated in FIG. 1 is connected to the piezoelectric speaker device 11 as the capacitive load C1 between capacitive load connection terminals VCP and VCN, and an input signal VIN for driving the piezoelectric speaker device 11 is input to the switching amplifier 10. The capacitive load C1 connected to the switching amplifier 10 may take any form other than the piezoelectric speaker device 11.

The switching amplifier 10 includes an inverting amplifier circuit 10a, a signal correction circuit 10b, a PWM circuit 10c, a gate drive control circuit (gate driver) 10d, a switching drive circuit 10f, bias voltage output circuits 10g, a low-pass filter circuit 10h, and a differential/single-ended conversion circuit 10i.

The inverting amplifier circuit 10a is a circuit that outputs an input inverted signal INV, which is provided by inverting the phase of an error correction signal ERR.

The signal correction circuit 10b is a circuit that detects an error between amplitudes of an input signal VIN and a differential signal of the output signals POUT and NOUT, and outputs an error correction signal ERR so as to correct the amplitudes of the differential signal of the output signals POUT and NOUT according to the detected amplitude error. The signal correction circuit 10b is composed of an integrator, for example.

The PWM circuit 10c is a circuit that inputs the input inverted signal INV output from the inverting amplifier circuit 10a and the error correction signal ERR output from the signal correction circuit 10b. The pulse modulation is performed for the respective input signals in accordance with respective amplitude levels thereof, and then outputs pulse signals PULS_P and PULS_N differing in duty ratio. Herein, the PWM circuit 10c that performs pulse width modulation will be described as an example. Instead of the PWM circuit 10c, a PDM circuit that performs pulse density modulation, a PFM circuit that performs pulse frequency modulation, a PPM circuit that performs pulse phase modulation, or the like may be used as a pulse modulator that performs another type of pulse modulation.

The gate drive control circuit 10d is a circuit that inputs the pulse signals PULS_P and PULS_N, the input signal VIN, and reference voltages REFH and REFL, and outputs switching control signals PDRP, PDRN, NDRP, NDRN, MDRP, and MDRN for controlling on and off operations of switching elements of the switching drive circuit 10f.

The switching drive circuit 10f is a circuit that outputs the output signals POUT and NOUT for driving the piezoelectric speaker device 11 by performing a switching operation. This switching drive circuit 10f is composed of half bridge circuits 10fp and 10fn and a center bridge circuit 10fm.

The half bridge circuit 10fp is a circuit for charging the piezoelectric speaker device 11 from the capacitive load connection terminal VCP (positive terminal) by performing a switching operation according to the switching control signals PDRP and NDRN.

The half bridge circuit 10fn is a circuit for charging the piezoelectric speaker device 11 from the capacitive load connection terminal VCN (negative electrode) by performing a switching operation according to the switching control signals NDRP and PDRN.

The center bridge circuit 10fm is a circuit for discharging the piezoelectric speaker device 11 from the capacitive load connection terminal VCP or from capacitive load connection terminal VCN by performing a switching operation according to the switching control signals MDRP and MDRN.

The two bias voltage output circuits 10g are circuits that generate respective bias voltages Vb and apply them to the output signals POUT and NOUT, respectively, in order to prevent particularly the distortion of single-ended signals of the output signals POUT and NOUT.

The low-pass filter circuit 10h is a filtering circuit that removes high-frequency components of the output signals POUT and NOUT and extracts low-frequency components of the signals.

The differential/single-ended conversion circuit 10i is a circuit that converts differential signals of the output signals POUT and NOUT that have been filtered by the low-pass filter circuit 10h, to single-ended signals.

In the aforementioned switching amplifier 10, the signal correction circuit 10b, the low-pass filter circuit 10h, and the differential/single-ended conversion circuit 10i function as a feedback circuit. As a result, the switching amplifier 10 receives the input signal VIN and outputs the output signals POUT and NOUT for driving the piezoelectric speaker device 11. At the same time, the switching amplifier 10 feeds back the output signals POUT and NOUT to the input side, detects an amplification error between the input signal VIN and a differential signal of the output signals POUT and NOUT, and corrects an error occurring in the output signal of the PWM circuit 10c.

While the above embodiment has been described for the case where the input signal VIN is a single-ended signal, even the case where the input signal VIN is a fully-differential signal may achieve the same effects as in the aforementioned embodiment by configuring a circuit for the fully-differential signal, for example, circuit not including the differential/single-ended conversion circuit 10i in the feedback circuit.

(Configuration of PWM Circuit 10c)

Figure 2:
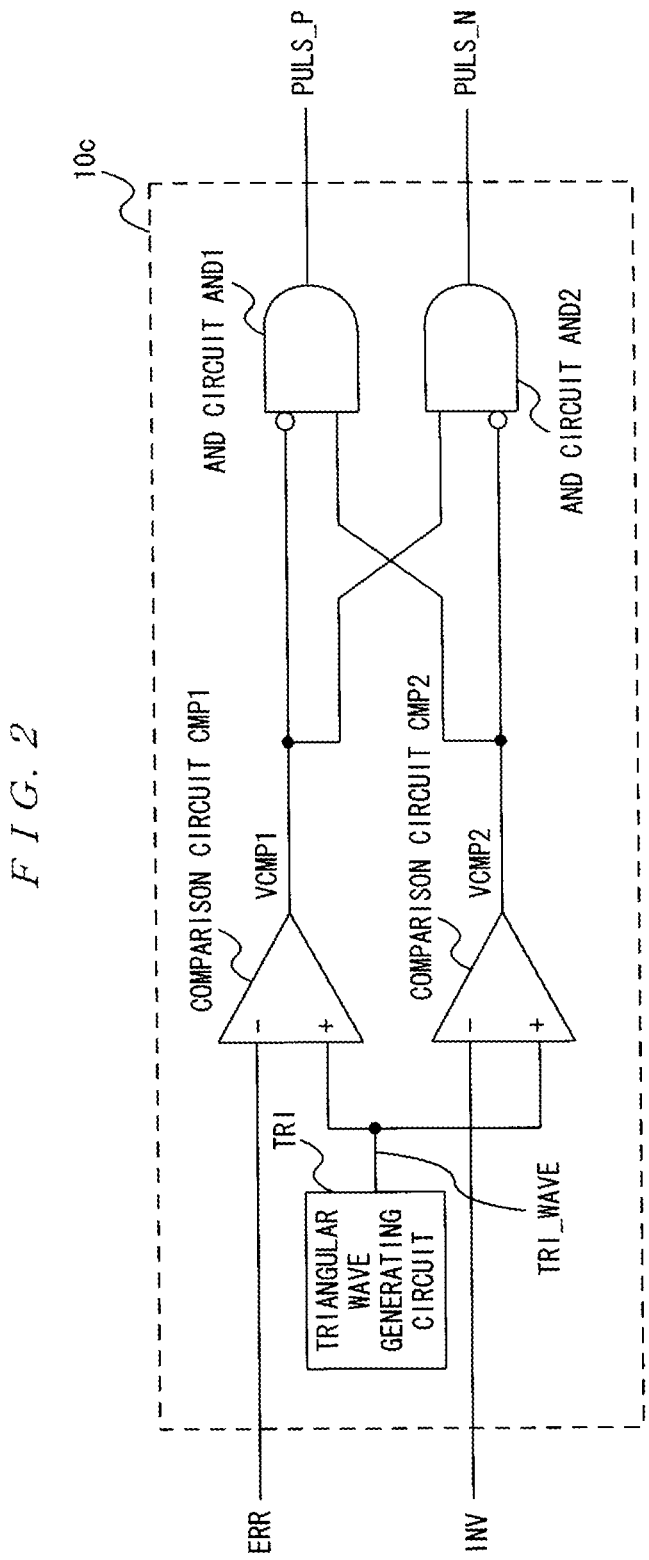
FIG. 2 is a block diagram illustrative of a configuration of a PWM circuit 10c.

Next, a configuration of the PWM circuit 10c will be described with reference to FIG. 2. FIG. 2 is a block diagram illustrative of the configuration of the PWM circuit 10c.

The PWM circuit 10c illustrated in FIG. 2 includes a triangular wave generating circuit TRI, a comparison circuit CMP1, a comparison circuit CMP2, an AND circuit AND1, and an AND circuit AND2.

The triangular wave generating circuit TRI is a circuit for generating a triangular wave TRI_WAVE, which is a reference wave for generating pulse signals PULS_P and PULS_N.

The comparison circuit CMP1 is an operational circuit that outputs a differential signal VCMP1 between the error correction signal ERR and the triangular wave TRI_WAVE, which is output from the triangular wave generating circuit TRI. This comparison circuit CMP1 outputs an H (High) level of the differential signal VCMP1, when the level of the triangular wave TRI_WAVE is greater than that of the error correction signal ERR. Moreover, this comparison circuit CMP1 outputs an L (Low) level of the differential signal VCMP1, when the level of the triangular wave TRI_WAVE is smaller than that of the error correction signal ERR.

The comparison circuit CMP2 is an operational circuit that outputs a differential signal VCMP2 between the input inverted signal INV and the triangular wave TRI_WAVE, which is output from the triangular wave generating circuit TRI.

This comparison circuit CMP2 outputs the high level of the differential signal VCMP2, when the level of the triangular wave TRI_WAVE is greater than that of the input inverted signal INV. This comparison circuit CMP2 outputs the low level of the differential signal VCMP2, when the level of the triangular wave TRI_WAVE is smaller than that of the input inverted signal INV.

The AND circuit AND1 is an operational circuit for performing a logical AND operation of the differential signal VCMP2 and an inverted signal of the differential signal VCMP1, and then outputting the pulse signal PULS_P. The AND circuit AND1 outputs a high level of the pulse signal PULS_P, when the differential signal VCMP1 is the low level and the differential signal VCMP2 is the high level. When the differential signal VCMP1 and the differential signal VCMP2 have input levels other than those described above, a low level of the pulse signal PULS_P is output.

The AND circuit AND2 is an operational circuit for performing a logical AND operation of the differential signal VCMP1 and an inverted signal of the differential signal VCMP2, and then outputting the pulse signal PULS_N. The AND circuit AND2 outputs a high level of the pulse signal PULS_N, when the differential signal VCMP1 is the high level and the differential signal VCMP2 is the low level. When the differential signal VCMP1 and the differential signal VCMP2 have input levels other than those described above, a low level of the pulse signal PULS_N is output.

(Configuration of Gate Drive Control Circuit 10d)

Figure 3:
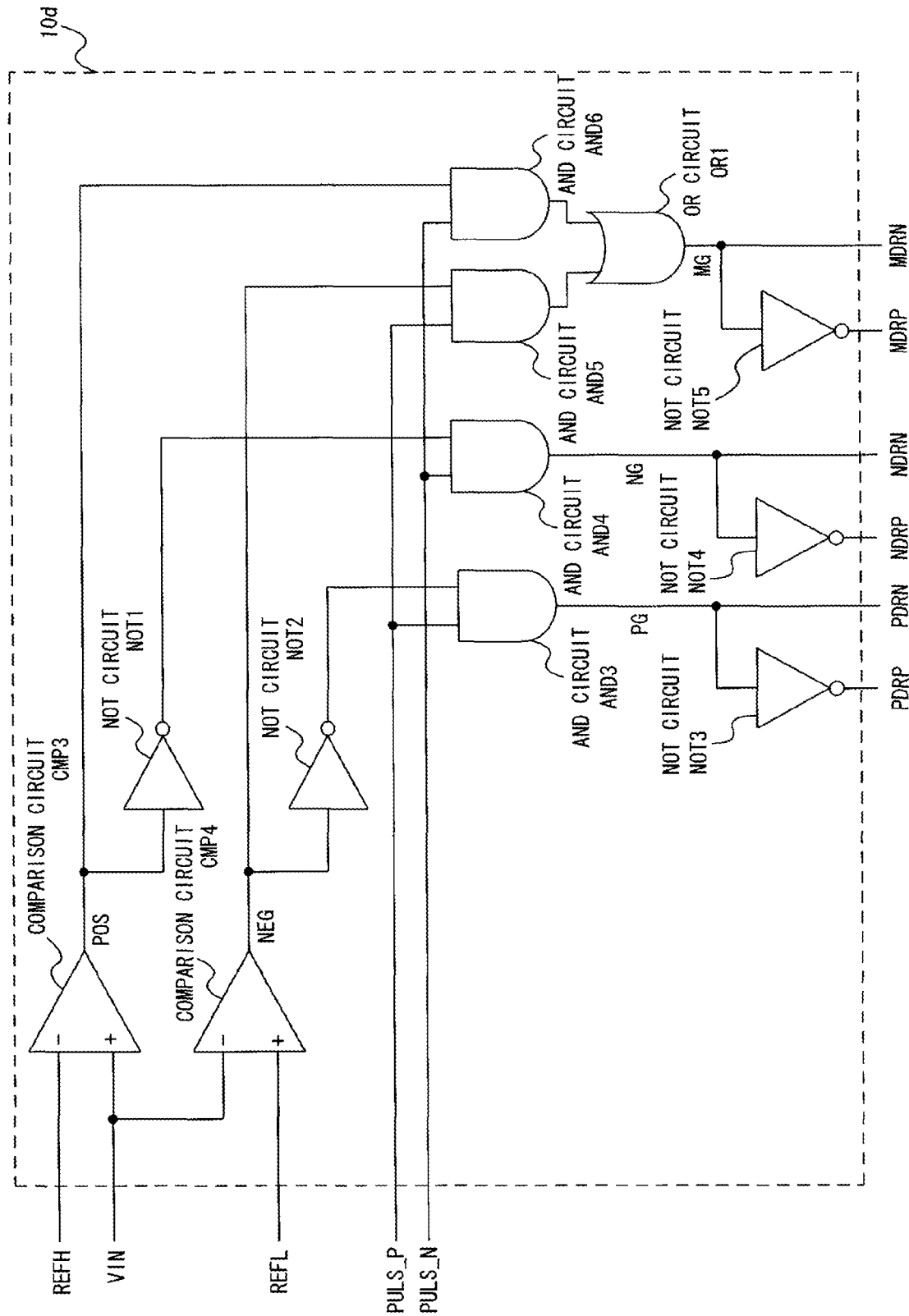
FIG. 3 is a block diagram illustrative of a configuration of a gate drive control circuit 10d.

Next, a configuration of the gate drive control circuit 10d will be described with reference to FIG. 3. FIG. 3 is a block diagram illustrative of the configuration of the gate drive control circuit 10d.

The gate drive control circuit 10d illustrated in FIG. 3 includes comparison circuits CMP3 and CMP4, NOT circuits NOT1 to NOT5, AND circuits AND3 to AND6, and an OR circuit OR1.

The comparison circuit CMP3 is an operational circuit that outputs a differential signal POS between the input signal VIN and the reference voltage REFH. The comparison circuit CMP3 outputs a high level of the differential signal POS, when the input signal VIN is greater than the reference voltage REFH. Moreover, the comparison circuit CMP3 outputs a low level of the differential signal POS, when the input signal VIN is less than the reference voltage REFH.

The comparison circuit CMP4 is an operational circuit that outputs a differential signal NEG between the input signal VIN and the reference voltage REFL. The comparison circuit CMP4 outputs a high level of the differential signal NEG, when the input signal VIN is less than the reference voltage REFL. Moreover, the comparison circuit CMP4 outputs a low level of the differential signal NEG, when the input signal VIN exceeds the reference voltage REFL.

The NOT circuit NOT1 is an operational circuit that performs a logical NOT operation of the differential signal POS, and outputs a logical NOT value of the differential signal POS. The NOT circuit NOT1 outputs a low level when the differential signal POS is a high level, and outputs a high level when it is a low level.

The NOT circuit NOT2 is an operational circuit that performs a logical NOT operation of the differential signal NEG, and outputs a logical NOT value of the differential signal NEG. The NOT circuit NOT2 outputs a low level when the differential signal NEG is a high level, and outputs high level when it is a low level.

The NOT circuit NOT3 is an operational circuit that performs a logical NOT operation of a drive circuit control signal PG, and outputs the operation result as a switching control signal PDRP.

The NOT circuit NOT4 is an operational circuit that performs a logical NOT operation of a drive circuit control signal NG, and outputs the operation result as a switching control signal NDRP.

The NOT circuit NOT5 is an operational circuit that performs a logical NOT operation of a drive circuit control signal MG, and outputs the operation result as a switching control signal MDRP.

The AND circuit AND3 is an operational circuit that performs a logical AND operation of the pulse signal PULS_P and an inverted signal of the differential signal NEG, and outputs a drive circuit control signal PG or the operation result as a switching control signal PDRN.

The AND circuit AND4 is an operational circuit that performs a logical AND operation of the pulse signal PULS_N and an inverted signal of the differential signal POS, and outputs a drive circuit control signal NG or the operation result as a switching control signal NDRN.

The AND circuit AND5 is an operational circuit that performs a logical AND operation of the differential signal NEG and the pulse signal PULS_P, and outputs the operation result to the OR circuit OR1.

The AND circuit AND6 is an operational circuit that performs a logical AND operation of the differential signal POS and the pulse signal PULS_N, and outputs the operation result to the OR circuit OR1.

A logical value from the AND circuit AND 5 and a logical value from the AND circuit AND 6 are input into the OR circuit OR1. Then, the OR circuit OR1 performs a logical OR operation of the two logical values, and outputs a drive circuit control signal MG or the calculation result as a switching control signal MDRN.

(Configuration of Switching Drive Circuit 10f)

Next, a configuration of the switching drive circuit 10f will be described with reference to FIG. 4. FIG. 4 is a block diagram illustrative of the configuration of the switching drive circuit 10f.

This switching drive circuit 10f of FIG. 4 includes the half bridge circuits 10fp and 10fn and the center bridge circuit 10fm. The capacitive load C1 connected between the capacitive load connection terminals VCP and VCN of the switching drive circuit 10f is the aforementioned piezoelectric speaker device 11.

The half bridge circuit 10fp includes switches SWPP and SWNN each functioning as a charge and discharge switching element for charging or discharging the capacitive load C1. The switch SWPP is connected between a supply voltage VDD that is boosted by a booster circuit or the like and the capacitive load connection terminal VCP. The switch SWNN is connected between the capacitive load connection terminal VCP and a reference voltage VSS. Specifically, the reference voltage VSS is described as ground in this embodiment.

The half bridge circuit 10fn is composed of switches SWNP and SWPN each functioning as a discharge switching element. The switch SWNP is connected between the supply voltage VDD and the capacitive load connection terminal VCN. The switch SWPN is connected between the capacitive load connection terminal VCN and the reference voltage VSS.

The center bridge circuit 10fm is composed of switches SWMP and SWMN each functioning as a discharge switching element for discharging the charged capacitive load C1 by short-circuiting between both terminals of the capacitive load C1, namely between the capacitive load connection terminals VCP and VCN. The switches SWMP and SWMN respectively are connected between the capacitive load connection terminals VCP and VCN.

The switches SWPP, SWNP, and SWMP included in the aforementioned bridge circuits are switching elements composed of pMOS transistors or the like. Moreover, the switches SWPN, SWNN, and SWMN are switching elements composed of nMOS transistors, for example. Each of the switches SWPP, SWNN, SWNP, SWPN, SWMP, and SWMN functions as a switch connecting and disconnecting a circuit by performing on and off operation according to the switching control signals PDRP, NDRN, NDRP, PDRN, MDRP, and MDRN, respectively.

The capacitive load C1 has its positive terminal connected to the capacitive load connection terminal VCP and its negative terminal connected to the capacitive load connection terminal VCN. The capacitive load C1 is charged and discharged relative to the supply voltage VDD by performing the on and off operation of the respective switches SWPP, SWPN, SWNP, SWNN, SWMP, and SWMN.

Moreover, in order to short-circuit between both of the terminals of the capacitive load C1, in addition to the structure including the two switching elements of the switches SWMP and SWMN, another structure including only a single switching element composed of either an nMOS transistor or a pMOS transistor may be applicable.

Note that by inserting a resistance between the capacitive load connection terminal VCP and the positive terminal of the capacitive load C1, and between the capacitive load connection terminal VCN and the positive terminal of the capacitive load C1, and limiting the electric current flow to the capacitive load C1 by that resistance, it is made possible to protect the circuits from breakdown due to stress, heat generation, and the like caused by an excessive electric current. Furthermore, the aforementioned resistance is capable of protecting the circuits in the same manner even if only it is inserted in either one of the sides.

(Configuration of Bias Voltage Output Circuit 10g)

Figure 5:
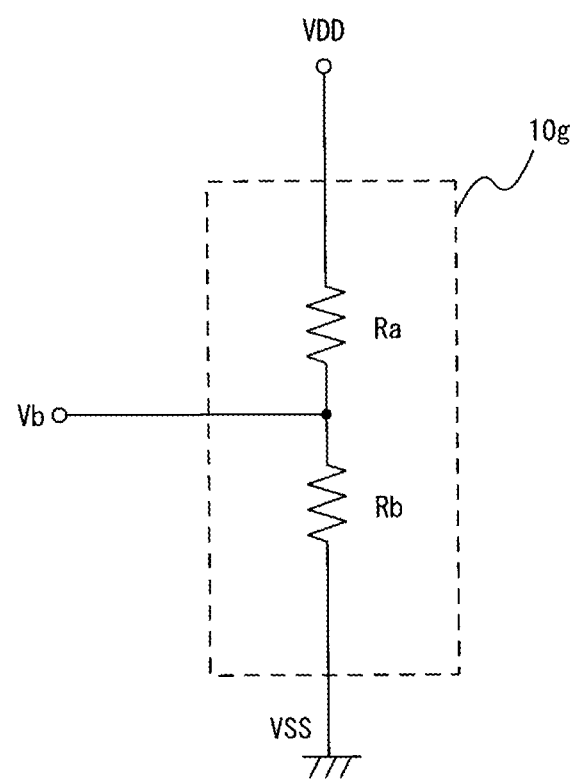
FIG. 5 is a block diagram illustrative of a configuration of a bias voltage output circuit 10g.

Next, a configuration of the bias voltage output circuit 10g will be described with reference to FIG. 5. FIG. 5 is a block diagram illustrative of a configuration of the bias voltage output circuit 10g.

The bias voltage output circuit 10g illustrated in FIG. 5 includes resistances Ra and Rb.

Each of the resistances Ra and Rb is an element for lowering voltage to a bias voltage Vb, for example, substantially a half the supply voltage VDD boosted by a booster circuit or the like.

The bias voltage output circuit 10g lowers the supply voltage VDD to substantially a half using the resistances Ra and Rb, and outputs the voltage as bias voltage Vb, which is to be applied to an output signal POUT or NOUT. Note that the bias voltage Vb may be varied by changing the resistances Ra and Rb.

(Operation Method of PWM Circuit 10c)

Figure 6:
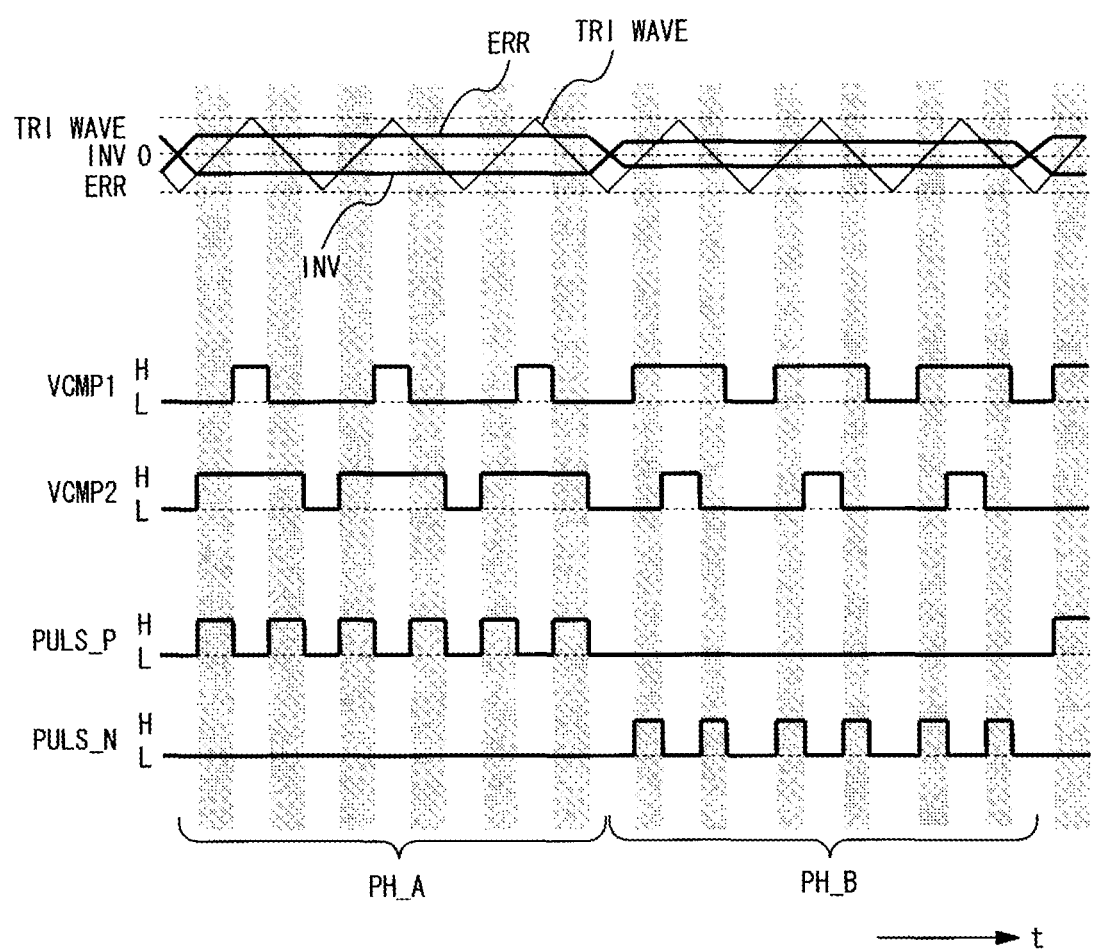
FIG. 6 is a timing chart showing each signal level of the PWM circuit 10c.

Next, an operation method of the PWM circuit 10c will be described with reference to FIG. 6. FIG. 6 is a timing chart showing each signal level of the PWM circuit 10c. The horizontal axis of the timing chart shown in FIG. 6 indicates time. Moreover, the vertical axis of the timing chart shows respective signal levels of the triangular wave TRI_WAVE, the input inverted signal INV, the error correction signal ERR, the differential signals VCMP1 and VCMP2, and the pulse signals PULS_P and PULS_N.

With the PWM circuit 10c, a triangular wave TRI_WAVE as illustrated is generated at a constant cycle by the triangular generating circuit TRI. In addition, the input inverted signal INV with the same amplitude but inverted polarity from each other, and the error correction signal ERR are input into the PWM circuit 10c.

As described above, the comparison circuit CMP1 outputs a high level as the differential signal VCMP1, when the level of the triangular wave TRI_WAVE is greater than the level of the error correction signal ERR. Moreover, the comparison circuit CMP2 outputs a high level as the differential signal VCMP2, when the level of the triangular wave TRI_WAVE is greater than the level of the input inverted signal INV.

Furthermore, the AND circuit AND1 outputs a high level as the pulse signal PULS_P, when the differential signal VCMP1 is a low level and the differential signal VCMP2 is a high level. The AND circuit AND2 outputs a high level as the pulse signal PULS_N, when the differential signal VCMP1 is a high level and the differential signal VCMP2 is a low level.

Therefore, in phase PH_A where the level of the error correction signal ERR is higher than that of the input inverted signal INV, the level of the pulse signal PULS_P is repeatedly alternated between the high level and the low level, so that the pulse signal PULS_P is intermittently output from the PWM circuit 10c.

Meanwhile, in phase PH_B where the level of the input inverted signal INV is higher than that of the error correction signal ERR, the level of the pulse signal PULS_N is repeatedly alternated between the high level and the low level, so that the pulse signal PULS_N is intermittently output from the PWM circuit 10c.

Also after the phase PH_B, the PWM circuit 10c repeatedly alternates the phases PH_A and PH_B, and intermittently outputs the pulse signals PULS_P and PULS_N in turns.

(Operation Method of Gate Driving Control Circuit 10d)

Next, an operation method of the gate drive control circuit 10d will be described with reference to FIG. 7 and FIG. 8.

Figure 7:
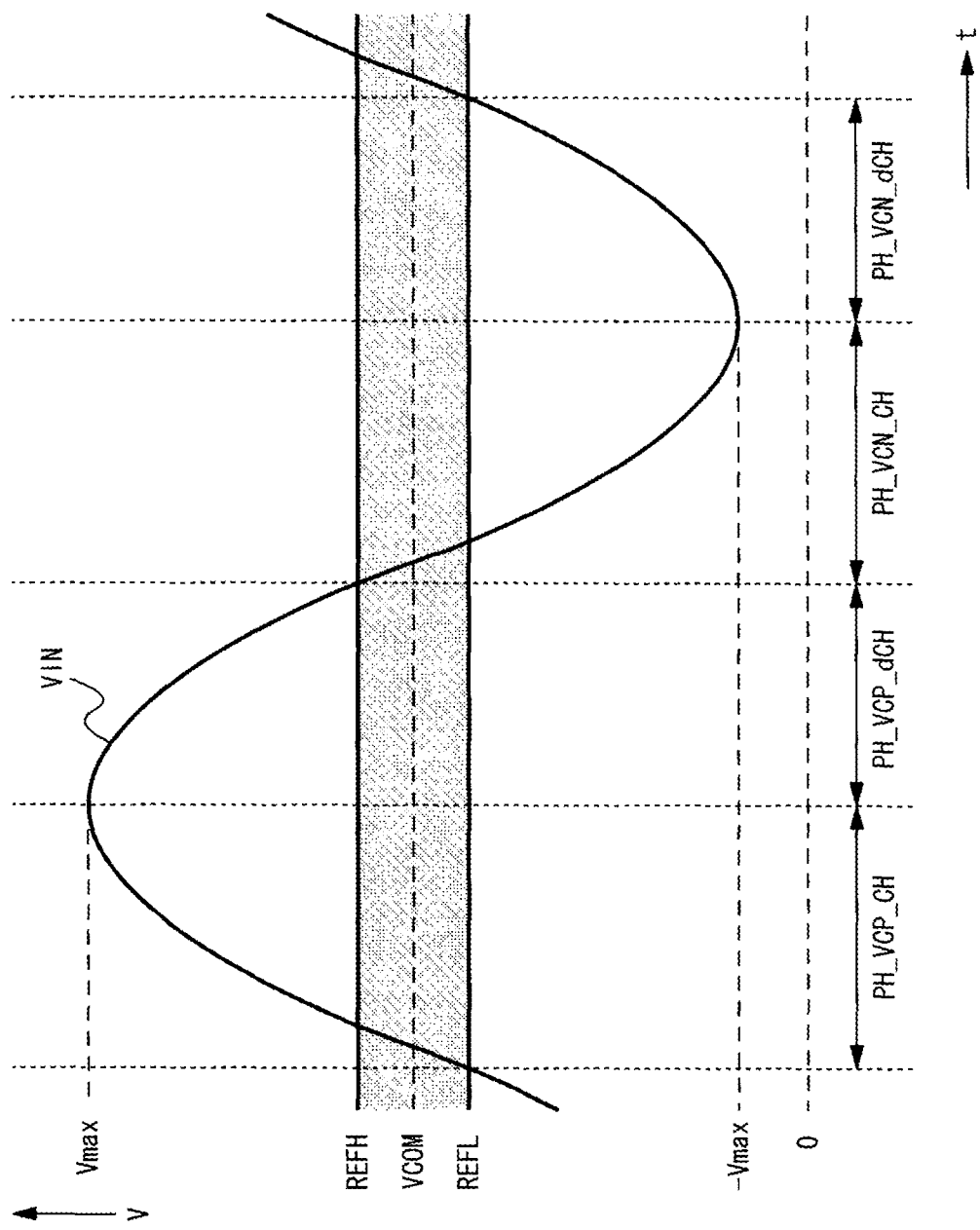
FIG. 7 is a timing chart showing an input signal VIN input to the gate drive control circuit 10d and respective signal levels of reference voltages REFH and REFL.

FIG. 7 is a timing chart showing the input signal VIN input to the gate drive control circuit 10d and respective signal levels of the reference voltages REFH and REFL. FIG. 8 is a timing chart showing respective signal levels of the switching control signals PDRP, PDRN, NDRP, NDRN, MDRP, and MDRN output from the gate drive control circuit 10d.

Figure 8:
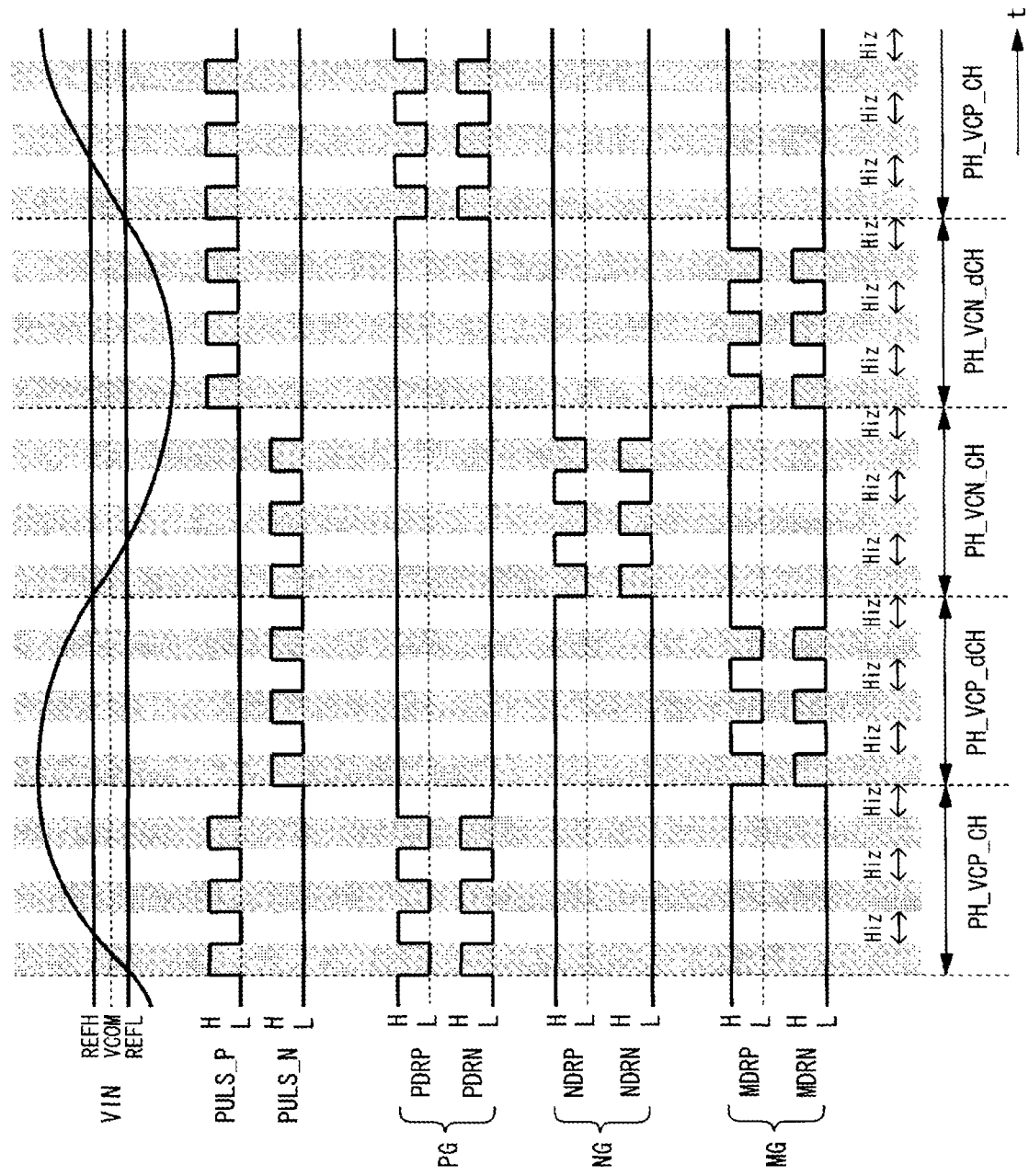
FIG. 8 is a timing chart showing respective signal levels of switching control signals PDRP, PDRN, NDRP, NDRN, MDRP, and MDRN output from the gate drive control circuit 10d.

The Horizontal axis in each of the timing charts shown in FIGS. 7 and 8 indicates time, and the vertical axis indicates the respective signal levels.

As illustrated in the timing chart of FIG. 7, the input signal VIN and the two reference voltages REFH and REFL are input to the gate drive control circuit 10d. The reference voltage REFH is a higher voltage than an operation reference voltage VCOM, which is an operation reference voltage of the input signal VIN, whereas the reference voltage REFL is a lower voltage than the operation reference voltage VCOM.

The phase where the slope of the input signal VIN is positive from the reference voltage REFL until maximum voltage Vmax, which has the greatest level of the input signal VIN positively, is a VCP charging phase PH_VCP_CH in which the aforementioned capacitive load C1 is charged from the capacitive load connection terminal VCP.

Moreover, the phase in which the slope of the input signal VIN is negative from the maximum voltage Vmax until the reference voltage REFH is a VCP discharging phase PH_VCP_dCH in which the aforementioned capacitive load C1 is discharged from the capacitive load connection terminal VCP.

Furthermore, the phase in which the slope of the input signal VIN is negative from the reference voltage REFH until the minimum voltage −Vmax, which has the greatest level of the input signal VIN negatively, is a VCN charging phase PH_VCN_CH in which the aforementioned capacitive load C1 is charged from the capacitive load connection terminal VCN. Note that the minimum voltage −Vmax means that the voltage has a negative polarity relative to the Vcom reference and its amplitude is Vmax.

Furthermore, the phase in which the slope of the input signal VIN is positive from the minimum voltage −Vmax until the reference voltage REFL is a VCN discharging phase PH_VCN_dCH in which the aforementioned capacitive load C1 is discharged from the capacitive load connection terminal VCN.

In each operation of the aforementioned phases, any distortion at zero cross-over points of an output signal can be reduced, since the phases are not changed over when the input signal VIN is the operation reference voltage VCOM.

When the slope of the input signal VIN is positive, the phase is changed over from the VCN discharging phase PH_VCN_dCH to the VCP charging phase PH_VCP_CH, once the signal reaches the reference voltage REFL. Furthermore, when the slope of the input signal VIN is negative, the phase is changed over from the VCP discharging phase PH_VCP_dCH to the VCN charging phase PH_VCN_CH, once the signal reaches the reference voltage REFH. In this manner, the change-over timing for changing to a discharging phase is set to the reference voltages REFH and REFL, thereby suppressing any zero cross distortion of the output signal.

As shown in the timing chart of FIG. 8, within the VCP charging phase PH_VCP_CH, there are phases where a high level of the pulse signal PULS_P is input into the gate driving control circuit 10d. In these phases, the capacitive load C1 is charged from the capacitive load connection terminal VCP. Therefore, the gate driving control circuit 10d outputs a low level of the switching control signal PDRP and a high level of the switching control signal PDRN. However, within the VCP charging phase PH_VCP_CH, in the phases where a low level of the pulse signal PULS_P is input into the gate driving control circuit 10d, the gate driving control circuit 10d outputs a high level of the switching control signal PDRP and a low level of the switching control signal PDRN. Accordingly, these phases correspond to floating phases Hiz where the capacitive load C1 is not charged. That is, the floating phases Hiz are hold time where the electric charge does not move.

Moreover, within the VCP discharging phase PH_VCP_dCH subsequent to the VCP charging phase PH_VCP_CH, there are phases where a high level of the pulse signal PULS_N is input into the gate driving control circuit 10d. In these phases, the capacitive load C1 is discharged from the capacitive load connection terminal VCP. Therefore, the gate driving control circuit 10d outputs low level of the switching control signal MDRP and a high level of the switching control signal MDRN. However, within the VCP discharging phase PH_VCP_dCH, the phases where a low level of the pulse signal PULS_N is input into the gate driving control circuit 10d, the gate driving control circuit 10d outputs a high level of the switching control signal MDRP and a low level of the switching control signal MDRN. Accordingly, these phases correspond to floating phases Hiz where the capacitive load C1 is not charged.

Furthermore, within the VCN charging phase PH_VCN_CH subsequent to the VCP discharging phase PH_VCP_dCH, there are phases where a high level of the pulse signal PULS_N is input into the gate driving control circuit 10d. In these phases, the capacitive load C1 is charged from the capacitive load connection terminal VCN. Therefore, the gate driving control circuit 10d outputs a low level of the switching control signal NDRP and a high level of the switching control signal NDRN. However, within the VCN charging phase PH_VCN_CH, the phases where a low level of the pulse signal PULS_N is input into the the gate driving control circuit 10d outputs a high level of the switching control signal NDRP and a low level of the switching control signal NDRN. Accordingly, these phases correspond to floating phases Hiz where the capacitive load C1 is not charged.

Furthermore, within the VCN discharging phase PH_VCN_dCH subsequent to the VCN charging phase PH_VCN_CH, there are phases where a high level of the pulse signal PULS_P is input. In these phases, in order for the electric charge for the capacitive load C1 to be discharged from the capacitive load connection terminal VCN, the gate driving control circuit 10d outputs a low level of the switching control signal MDRP and a high level of the switching control signal MDRN. However, within the VCN discharging phase PH_VCN_dCH, other phases where a low level of the pulse signal PULS_P is input into the gate driving control circuit 10d outputs a high level of the switching control signal MDRP and a low level of the switching control signal MDRN. Accordingly, these phases correspond to floating phases Hiz where the capacitive load C1 is not charged.

(Operation Method of Switching Drive Circuit 10f)

Figure 9:
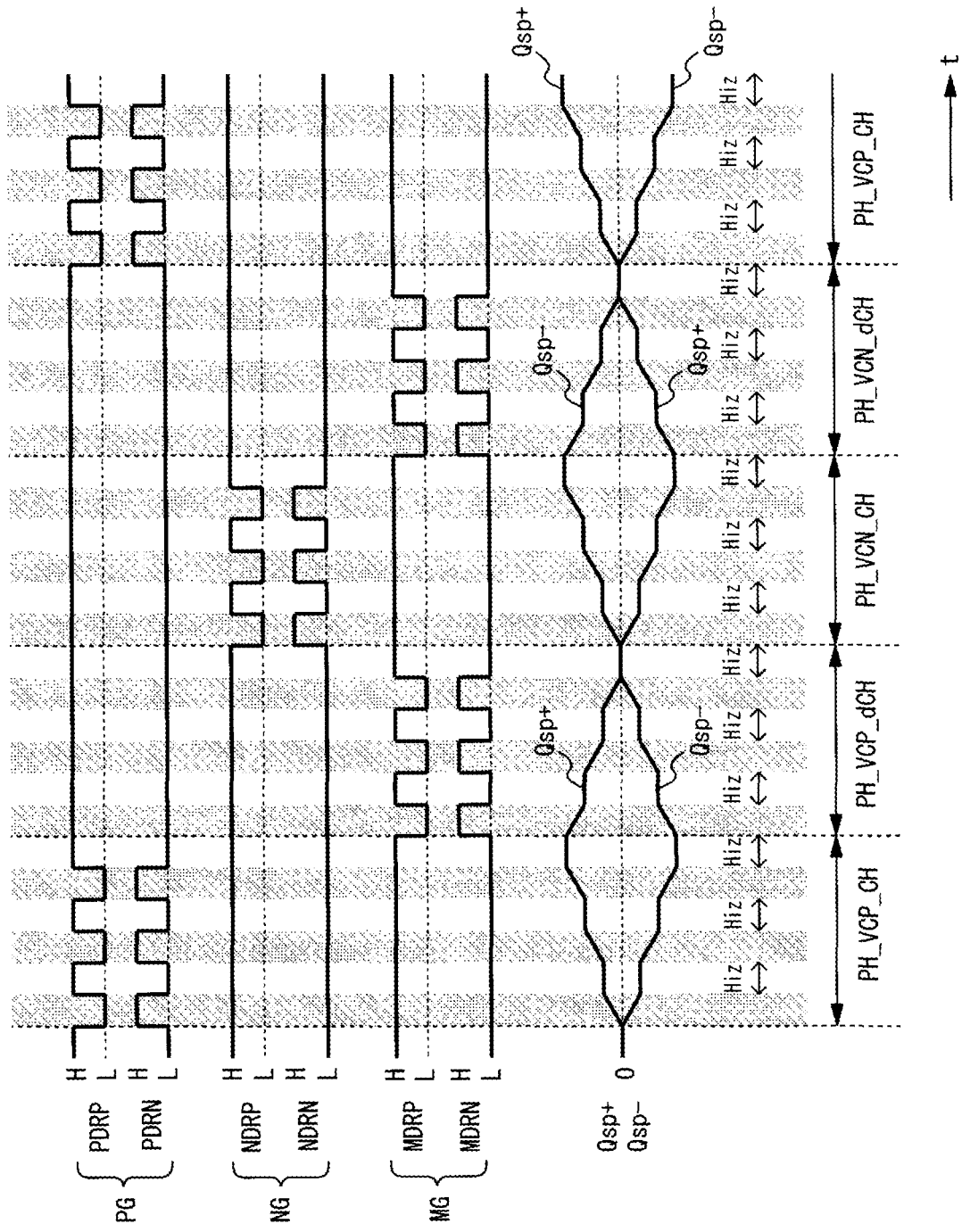
FIG. 9 is a timing chart showing signal levels of the switching drive circuit 10f and quantities of electric charge Qsp+ and Qsp− of a capacitive load C1.
Figure 10:
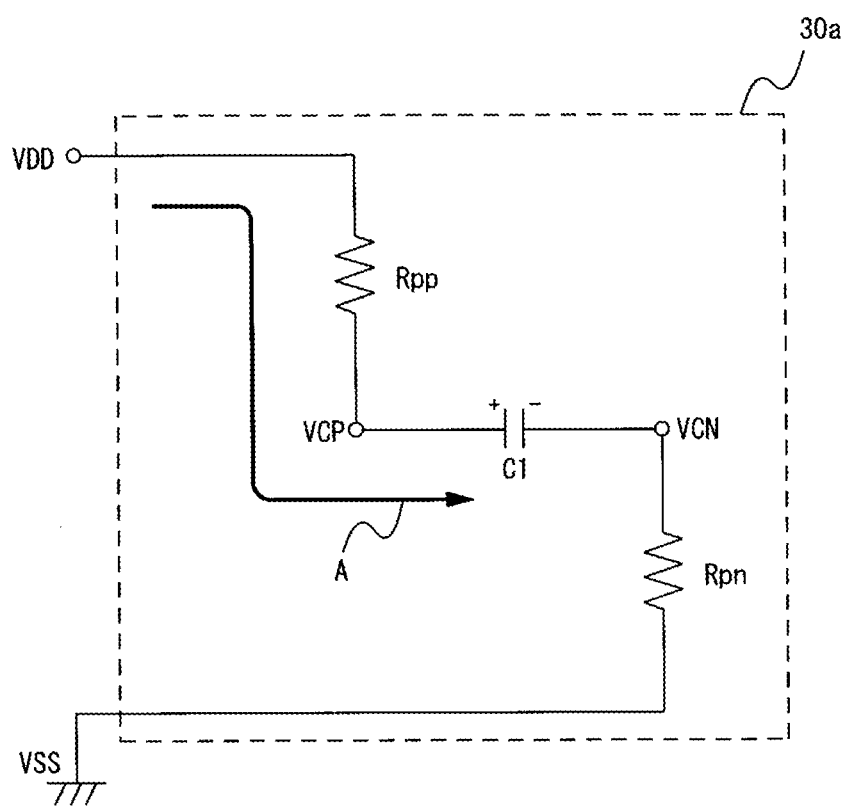
FIG. 10 is a circuit diagram illustrative of an equivalent circuit in a VCP charging phase of the switching drive circuit 10f.

Next, an operation method of the switching drive circuit 10f will be described with reference to FIG. 9 to FIG. 12. FIG. 9 is a timing chart showing respective signal levels of the switching drive circuit 10f and quantities of electric charge Qsp+ and Qsp− of the capacitive load C1 on the positive terminal side and on the negative terminal side. FIG. 10 is a circuit diagram illustrative of an equivalent circuit in a VCP charging phase of the switching drive circuit 10f. FIG. 11 is a circuit diagram illustrative of an equivalent circuit in a VCP discharging phase of the switching drive circuit 10f. FIG. 12 is a circuit diagram illustrative of an equivalent circuit in a VCN charging phase of the switching drive circuit 10f.

The horizontal axis of the timing chart shown in FIG. 9 indicates time. Moreover, the vertical axis shows respective signal levels of the switching control signals PDRP, PDRN, NDRP, NDRN, MDRP, and MDRN and the quantities of electric charge Qsp+ and Qsp− of the capacitive load C1.

In the VCP charging phase PH_VCP_CH as shown in FIG. 9, a low level of the switching control signal PDRP and a high level of the switching control signal PDRN are input into the switching drive circuit 10f. At this time, in the switching drive circuit 10f shown in FIG. 4, when the switches SWPP and SWPN are respectively changed over from being off to on, on-resistances Rpp and Rpn are generated as a result of the switches SWPP and SWPN being turned to on state to behave like an equivalent circuit 30a shown in FIG. 10. As a result, the capacitive load C1 is charged from the capacitive load connection terminal VCP in the direction of arrow A in the drawing.

As described above, in the VCP charging phase PH_VCP_CH in which the capacitive load C1 is charged, since there are floating phases Hiz where the capacitive load C1 is not charged, the quantities of electric charge Qsp+ and Qsp− of the capacitive load C1 increase in stages of linked gentle curves as shown in the drawing.

Next, in the VCP discharging phase PH_VCP_dCH as shown in FIG. 9, a low level of the switching control signal MDRP and a high level of the switching control signal MDRN are input into the switching drive circuit 10f. Then, in the switching drive circuit 10f shown in FIG. 4, since the switches SWMP and SWMN are respectively changed over from off state to on state and on-resistances Rmp and Rmn are generated as a result of the switches SWMP and SWMN being turned to on state, whereby the switching drive circuit 10f is short-circuited like an equivalent circuit 30b as shown in FIG. 11. As a result, the electric charge of the capacitive load C1 charged in the immediately preceding phase is discharged from the capacitive load connection terminal VCP in the directions of arrows B1 and B2 shown in the drawing.

As described above, in the VCP discharging phase PH_VCP_dCH, since there are floating phases Hiz where the capacitive load C1 is not discharged, the quantities of electric charge Qsp+ and Qsp− of the capacitive load C1 decrease in stages of linked gentle curves as shown in the drawing.

Next, in the VCN charging phase PH_VCPN_dCH as shown in FIG. 9, a low level of the switching control signal NDRP and a high level of the switching control signal NDRN are input into the switching drive circuit 10f. At this time, in the switching drive circuit 10f shown in FIG. 4, the switches SWNP and SWNN are respectively changed over from being off state to on state, and on-resistances Rnp and Rnn are generated as a result of the switches SWNP and SWNN being turned to on state to behave like an equivalent circuit 30c shown in FIG. 12. As a result, the capacitive load C1 is charged from the capacitive load connection terminal VCN in the direction of arrow C shown in the drawing.

As described above, in the VCN charging phase PH_VCN_CH, the quantities of electric charge Qsp+ and Qsp− of the capacitive load C1 increase with the opposite polarity to that in the VCP charging phase PH_VCP_CH as shown in the drawing.

Next, in the VCN discharging phase PH_VCN_dCH as shown in FIG. 9, a low level of the switching control signal MDRP and a high level of the switching control signal MDRN are input into the switching drive circuit 10f. At this time, the switches SWMP and SWMN are respectively changed over from off state to on state, and on-resistances Rmp and Rmn are generated, whereby the switching drive circuit 10f shown in FIG. 4 behaves like the equivalent circuit 30b of FIG. 11. However, the capacitive load C1 are discharged from the capacitive load connection terminal VCN in the opposite directions to arrows B1 and B2 in the drawing.

As described above, in the VCN discharging phase PH_VCN_dCH, the quantities of electric charge Qsp+ and Qsp− of the capacitive load C1 decrease with the opposite polarity to that in the VCP discharging phase PH_VCP_dCH as shown in the drawing.

In this manner, the operation method of the switching amplifier 10 repeats operations in the order of the VCP charging phase PH_VCP_CH, the VCP discharging phase PH_VCP_dCH, the VCN charging phase PH_VCN_CH, and the VCN discharging phase PH_VCN_dCH.

According to this method, a charging phase per cycle for the input signal VIN that is a reference for that operation may be set to the phase in which the slope of the input signal VIN is positive from the reference voltage REFL or greater until the maximum voltage, or to the phase in which the slope of the input signal VIN is negative from the reference voltage REFH or less until the minimum voltage.

Therefore, unlike the drive circuit described in Background Art, it is not necessary to charge in all periods within a single cycle of an input signal, and thus only a half of the duration is needed for charging. Moreover, a discharging phase is changed over to a charging phase when the input signal becomes a first reference voltage or a second reference voltage, thereby reducing the zero cross distortion.

Next, an operation method of the gate drive control circuit 10d in the case of a different waveform than that of the aforementioned input signal VIN is described with reference to FIG. 13.

Figure 13:
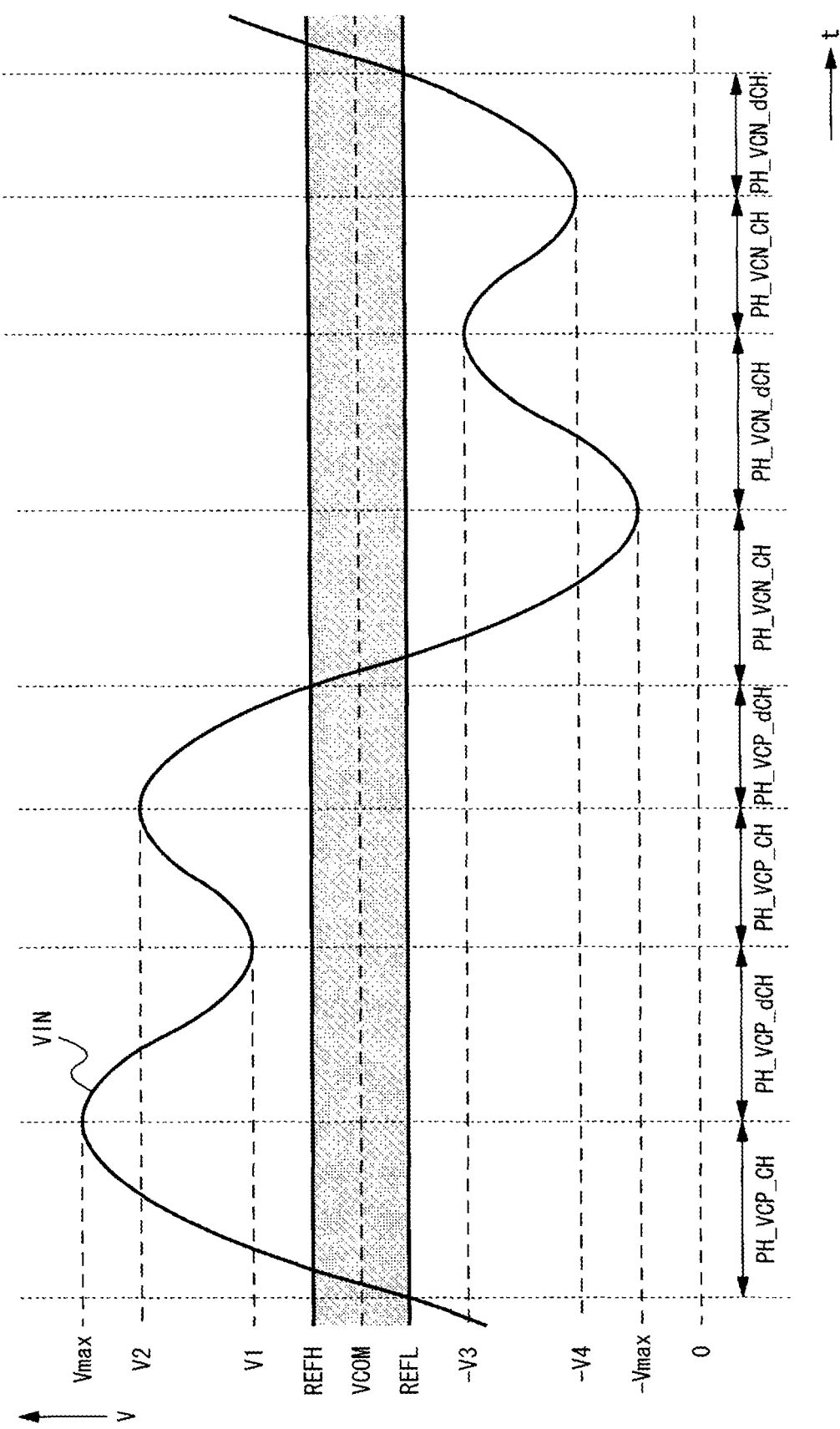
FIG. 13 is a timing chart showing a different input signal VIN than the input signal VIN shown in FIG. 7 that is input in the gate drive control circuit 10d, and respective signal levels of reference voltages REFH and REFL.

FIG. 13 is a timing chart showing an input signal VIN different from the input signal VIN shown in FIG. 7, and the respective signal levels of the reference voltages REFH and REFL, which are all input to the gate drive control circuit 10d. The horizontal axis of the timing chart shown in FIG. 13 indicates time, and the vertical axis shows the respective signal levels.

The slope of the input signal VIN shown in FIG. 13 changes two more times than that of the input signal VIN shown in FIG. 7 while the voltage level thereof changes from the reference voltage REFL to the maximum voltage Vmax, and from the maximum voltage Vmax to the reference voltage REFH. Moreover, the slope of this input signal VIN changes two more times than that of the input signal VIN shown in FIG. 7 while the voltage level thereof changes from the reference voltage REFH to the minimum voltage −Vmax, and from the minimum voltage −Vmax to the reference voltage REFL.

As shown in the timing chart of FIG. 13, the input signal VIN and the two reference voltages REFH and REFL are input to the gate drive control circuit 10d. The reference voltage REFH is a higher voltage than the operation reference voltage VCOM, which is an operation reference voltage of the input signal VIN, whereas the reference voltage REFL is a lower voltage than the operation reference voltage VCOM.

The phase in which the slope of the input signal VIN is positive from the reference voltage REFL until maximum voltage Vmax, which is the greatest level of the input signal VIN in the positive direction, is a VCP charging phase PH_VCP_CH in which the aforementioned capacitive load C1 is charged from the capacitive load connection terminal VCP.

Next, the phase in which the slope of the input signal VIN is negative from the maximum voltage Vmax until a voltage V1 is a VCP discharging phase PH_VCP_dCH in which the aforementioned capacitive load C1 is discharged from the capacitive load connection terminal VCP.

The voltage V1 is a higher voltage than the reference voltage REFH, and at the point where the input signal VIN becomes the voltage V1, the slope of the input signal VIN changes from negative to positive, namely changing its polarity.

Furthermore, the phase in which the slope of the input signal VIN is positive from the voltage V1 until a voltage V2 is a VCP charging phase PH_VCP_CH in which the aforementioned capacitive load C1 is charged from the capacitive load connection terminal VCP. The voltage V2 is a higher voltage than the reference voltage REFH, and at the point where the input signal VIN becomes the voltage V2, the slope of the input signal VIN changes from positive to negative, namely changing its polarity.

Note that the voltages V1 and V2 respectively have a positive polarity with the operation reference voltage Vcom as a reference, and its amplitude at the voltage V2 is greater than that at the voltage V1.

Moreover, the phase in which the slope of the input signal VIN is negative from the voltage V2 until the reference voltage REFH is a VCP discharging phase PH_VCP_dCH in which the aforementioned capacitive load C1 is discharged from the capacitive load connection terminal VCP.

Furthermore, the phase in which the slope of the input signal VIN is negative from the reference voltage REFH until minimum voltage −Vmax, which is the greatest level of the input signal VIN in the negative direction, is a VCN charging phase PH_VCN_CH in which the aforementioned capacitive load C1 is charged from the capacitive load connection terminal VCN. Note that the minimum voltage −Vmax means that a voltage that has a negative polarity with the operation reference voltage Vcom as a reference, where amplitude is the same as that at the point of the maximum voltage Vmax.

Next, the phase in which slope of the input signal VIN is positive from the minimum voltage −Vmax until a voltage −V3 is a VCN discharging phase PH_VCN_dCH in which the aforementioned capacitive load C1 is discharged from the capacitive load connection terminal VCN. The voltage −V3 is a lower voltage than the reference voltage VREFL, and at the point where the input signal VIN becomes the voltage −V3, the slope of the input signal VIN changes from positive to negative, namely changing its polarity.

Moreover, the phase in which the slope of the input signal VIN is negative from the voltage −V3 until a voltage −V4 is a VCN charging phase PH_VCN_CH in which the aforementioned capacitive load C1 is charged from the capacitive load connection terminal VCN. The voltage −V4 is a lower voltage than the reference voltage VREFL, and at the point where the input signal VIN becomes the voltage −V4, the slope of the input signal VIN changes from negative to positive, namely changing its polarity.

Note that the voltages −V3 and −V4 respectively have a negative polarity with the operation reference voltage Vcom as a reference, and its amplitude at the voltage −V4 is greater than that at the voltage −V3.

Furthermore, the phase in which the slope of the input signal VIN is positive from the voltage −V4 until the reference voltage REFL is a VCN discharging phase PH_VCN_dCH in which the aforementioned capacitive load C1 is discharged from the capacitive load connection terminal VCN.

In each operation of the aforementioned phases, any distortion of an output signal at zero cross-over points can be reduced, since the phases are not changed over when the input signal VIN is the operation reference voltage VCOM.

When the slope of the input signal VIN is positive, the phase is changed over from the VCN discharging phase PH_VCN_dCH to the VCP charging phase PH_VCP_CH, once the signal reaches the reference voltage REFL. Furthermore, when the slope of the input signal VIN is negative, the phase is changed over from the VCP discharging phase PH_VCP_dCH to the VCN charging phase PH_VCN_CH, once the signal reaches the reference voltage REFH. In this manner, it is made possible to control the zero cross distortion generated in the output signal by setting the change-over timing of changing to the charging phase to the reference voltages REFH and REFL.

Note that since the respective signal levels of the switching control signals PDRP, PDRN, NDRP, NDRN, MDRP, and MDRN output from the gate drive control circuit 10d are the same as the operations in respective phases shown in FIG. 8, even in the case where the input signal VIN has the waveform shown in FIG. 13, the description thereof will be omitted. Similarly, since the respective signal levels of the switching drive circuit 10f and the quantities of electric charge Csp+ and Csp− of the capacitive load C1 are also the same as the operations in the respective corresponding phases of FIG. 9, the description thereof will be omitted.

(Operation of the Bias Voltage Output Circuit)

Figure 14:
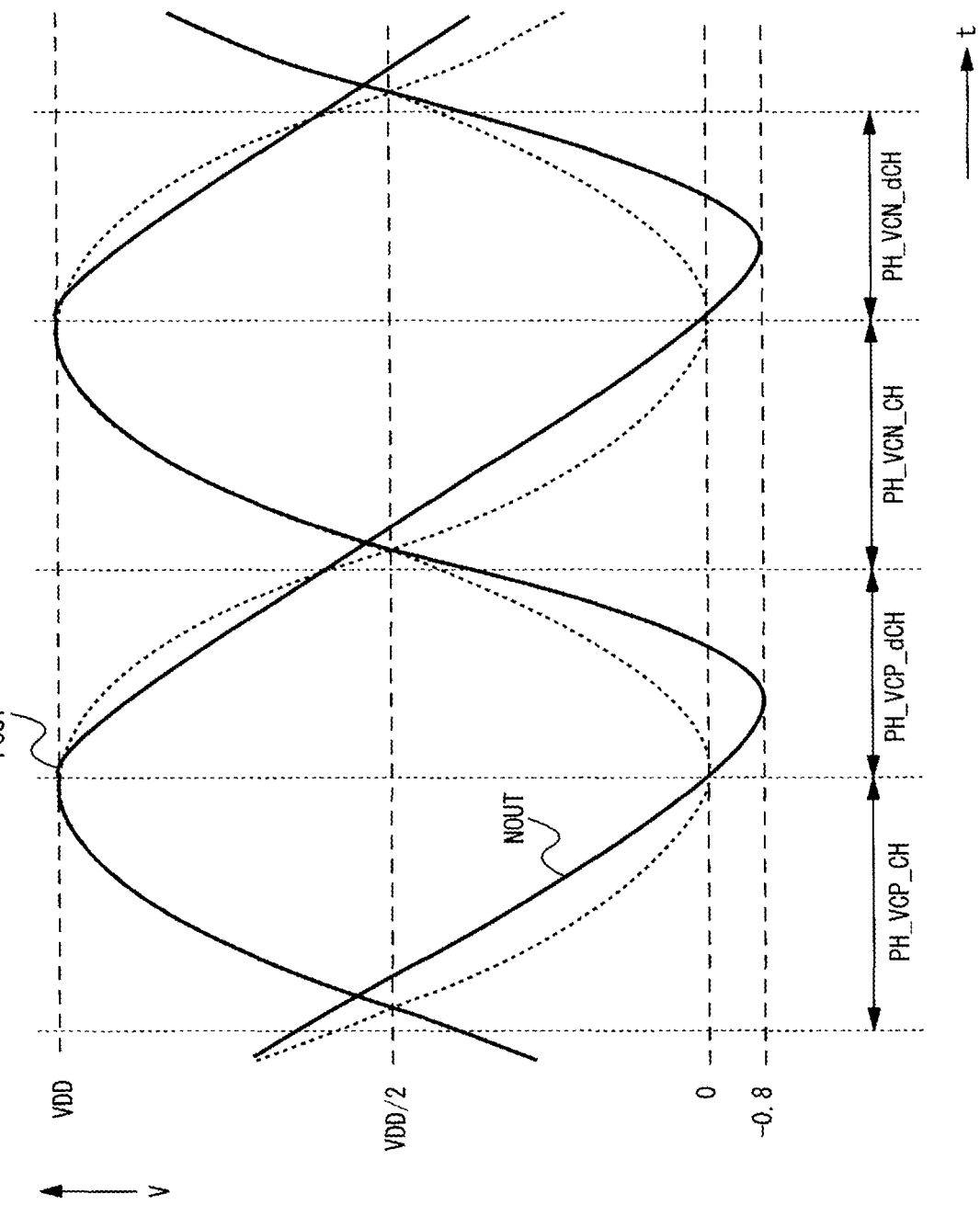
FIG. 14 is a waveform chart showing respective output signal levels at capacitive load connection terminals VCP and VCN.

Next, an operation method of the bias voltage output circuit will be described with reference to FIG. 14. FIG. 14 is a waveform chart showing each signal output level of the capacitive load connection terminals VCP and VCN.

As shown in the timing chart of FIG. 14, waveforms of output signals POUT and NOUT are formed depending on the input signal VIN while repeatedly performing each of the operations in the charging phase and the discharging phase.

In the VCP discharging phase PH_VCP_dCH and the VCN charging phase PH_VCN_CH, however, the capacitive load C1 is discharged by repeatedly performing two phases alternately where either of the terminals are cut off from the supply voltage VDD and the reference voltage VSS; namely, a phase in which both terminals are short-circuited to discharge the capacitive load C1 and a floating phase Hiz in which both terminals are open to prevent the discharging of the capacitive load C1. As a result, in the state of being cut off from the supply voltage VDD and the reference voltage VSS, there are cases where voltages of VCP and VCN are shifted towards the reference voltage VSS while the electric charge of the capacitive load C1 is being maintained, and there are cases where the output signals POUT and NOUT differ from the theoretical waveforms as indicated by dotted lines in the drawing.

The waveforms of the output signals POUT and NOUT may be distorted significantly by starting the discharging phase to decrease the output signal POUT or NOUT to the negative further than the theoretical value, achieving an electric potential that turns on body diodes of the MOS transistors used as the respective switches. The body diodes of the MOS transistors are kept on until the discharging phase ends and a charging phase begins.

As described above, the switching amplifier 10 according to the present embodiment is configured such that output signals with high quality and with less amplitude error may be obtained from the switching drive circuit 10f, and that the reactive power of the switching amplifier 10 may be reduced. Therefore, the differential output signals of the output signals POUT and NOUT are fed back to the input side, and an amplitude error between the input signal VIN and the output signals POUT and NOUT are detected, so that the duty ratio of the PWM circuit 10c is corrected to control feedback.

However, even when there is relatively a little distortion of the output waveforms of the differential output signals, there are cases where unnecessary harmonic waves are generated in the output waveform of the single-ended signal, resulting in electromagnetic interference (EMI) noise or spurious radiation.

However, the switching amplifier 10 according to the present embodiment has the bias voltage output circuits 10g connected to a feedback circuit for the output signals POUT and NOUT. The bias voltage output circuits 10g apply to the respective output signals POUT and NOUT a bias voltage Vb, for example a voltage VDD/2, that is relatively smaller than the driving power of the switching drive circuit 10f. The bias voltage Vb may take any level as far as it is lower than the supply voltage VDD.

In other words, even in a state of being cut off from the supply voltage VDD and the reference voltage VSS in the VCP discharging phase PH_VCP_dCH and the VCN charging phase PH_VCN_CH, voltages of the capacitive load connection terminals VCP and VCN may be prevented from changing toward the reference voltage VSS by applying the bias voltage Vb from the bias voltage output circuits 10g. Accordingly, distortion generated in the output waveforms of the output signals POUT and NOUT may be reduced by changing to the state of being cut off from the supply voltage VDD and the reference voltage VSS, thereby stabilizing the output waveforms of the output signals POUT and NOUT.

Note that the while there are two bias voltage output circuits 10g so as to apply the bias voltage Vb to the respective output signals POUT and NOUT, any one of the output signals POUT and NOUT may be provided, so as to apply the bias voltage Vb to any one of the output signals POUT and NOUT.

Modifications to the Embodiments

The embodiment given above is merely an illustration, and various changes may be made without departing from the technical spirit or scope of the disclosed claims. For example, the bias voltage output circuits 10g of the switching amplifier 10 according to this embodiment may be connected directly to the switching drive circuit 10f.

Figure 15:
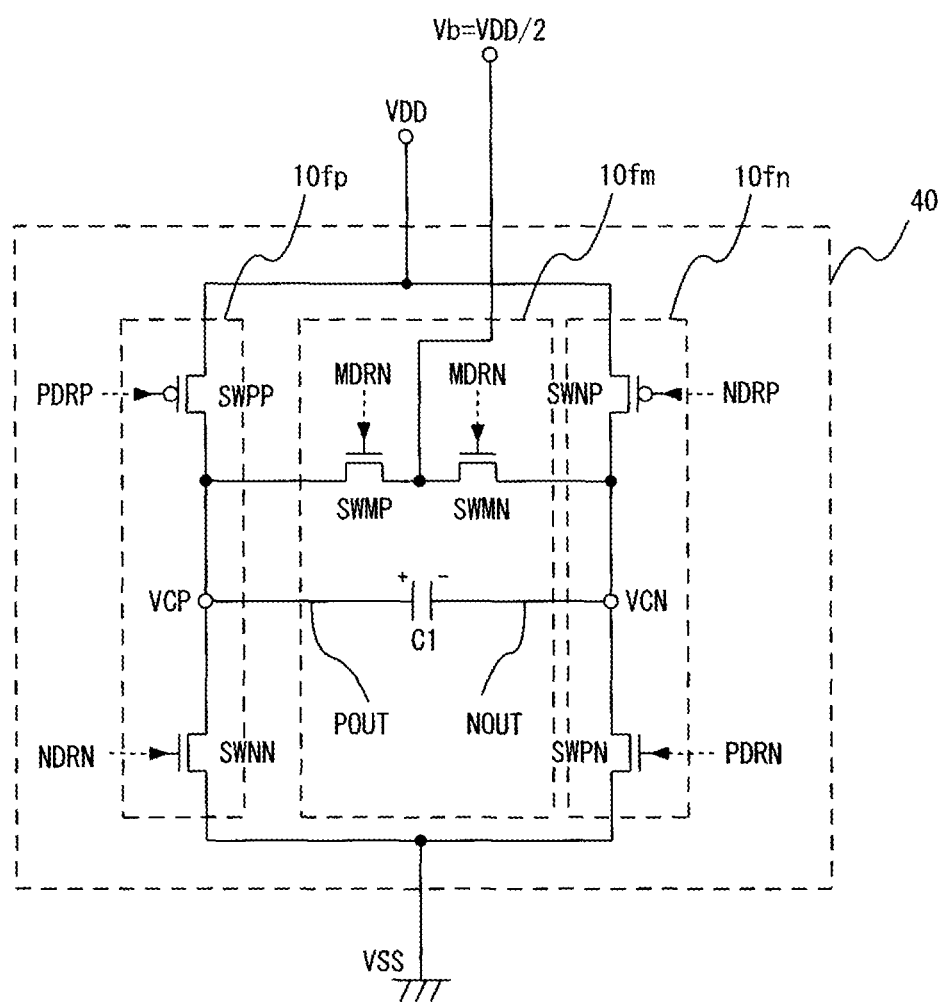
FIG. 15 is a circuit diagram illustrative of circuitry of a switching drive circuit 40 to which the bias voltage output circuit 10g is connected.

As a modification of the drive device according to the present embodiment, the circuitry of a switching drive circuit 40 to which the bias voltage output circuit 10g is connected will be described with reference to FIG. 15. FIG. 15 is a circuit diagram illustrative of circuitry of the switching drive circuit 40 to which the bias voltage output circuit 10g is connected.

The switching drive circuit 40 includes the same units as those in the switching drive circuit 10f shown in FIG. 4. However, the switching drive circuit 40 differs from the switching drive circuit 10f in that it is connected in parallel to the capacitive load C1 with the switch SWMP and the switch SWMN connected in series to each other.

Note that as described above, the two switches SWMP and SWMN respectively provided as switching elements for short-circuiting between both terminals of the capacitive load C1 may be composed of an nMOS transistor, a pMOS transistor, or the like. The use of only one switching element is also possible. In this example, both of the switches SWMP and SWMN are switching elements composed of an nMOS transistor. For this reason, the switch SWMP turns on and off according to the same switching control signal MDRN as the switch SWMN. Moreover, the switching amplifier 40 is supplied with the supply voltage VDD and a bias voltage Vb, for example, which is a half of the supply voltage VDD and is lower than the supply voltage and which is supplied between the switch SWMP and the switch SWMN.

The operation method of the switching drive circuit 40 repeatedly performs the operations in the order of the VCP charging phase PH_VCP_CH, the VCP discharging phase PH_VCP_dCH, the VCN charging phase PH_VCN_CH, and the VCN discharging phase PH_VCN_dCH in the same manner as the switching drive circuit 10f.

According to this method, a charging phase per cycle for the input signal VIN includes a phase in which the slope of the input signal VIN is positive from the reference voltage REFL or greater until the maximum voltage, and a phase in which the slope of the input signal VIN is negative from the reference voltage REFH or less until the minimum voltage. Moreover, the discharging phase is changed over to the charging phase when the input signal becomes equal to either a first reference voltage or a second reference voltage, thereby making it possible to reduce the zero cross distortion.

Furthermore, in the VCP discharging phase PH_VCP_dCH and the VCN discharging phase PH_VCN_dCH, when the switches SWMP and SWMN are turned on, the bias voltage Vb is applied to the capacitive load connection terminals VCP and VCN to short them.

The bias voltage Vb is half of the supply voltage VDD, for example, and the output from the capacitive load connection terminals VCP and VCN is effectively the same differential voltage between the output signals POUT and NOUT.

Accordingly, the switching drive circuit 40 applies the bias voltage Vb to the output signals POUT and NOUT from the bias voltage output circuits 10g, in the same manner as with the switching amplifier 10 described in the above embodiment. Consequently, even with the switching drive circuit 40, the distortion of the output waveforms of the output signals POUT and NOUT caused by a state of being cut off from the supply voltage VDD and the reference voltage VSS can be prevented, thereby stabilizing the output waveforms, in the same manner as with the switching amplifier 10.

SUMMARY

The switching amplifier 10 according to the present embodiment drives a capacitive load, such as a piezoelectric speaker device 11 or the like, by causing the switching drive circuit 10f to short-circuit between both terminals of the capacitive load C1 and thereby discharging the capacitive load C1. Therefore, in the discharging phase, the capacitive load C1 is short-circuited, namely it is substantially cut off from the supply voltage VDD and the reference voltage VSS.

Accordingly, the switching amplifier 10 according to the present embodiment is capable of reducing the charging phase per cycle to approximately a half thereof. Therefore, unlike the drive circuit described in Background Art, charging is not necessary in all periods within a cycle of an input signal.

Moreover, with the switching amplifier 10, the charging phase may include a phase in which the slope of the input signal VIN is positive from the reference voltage REFL or greater until the maximum voltage, or a phase in which the slope of the input signal VIN is negative from the reference voltage REFH or less until the minimum voltage, whereas the discharging phase is changed over to the charging phase, once it reaches either the first reference voltage or the second reference voltage, thereby reducing the zero cross distortion. This allows the switching amplifier 10 to drive the capacitive load efficiently with low power consumption and quality reproducibility of the input signal.

Furthermore, the switching amplifier 10 according to the present embodiment is capable of preventing the distortion of the output waveforms of the output signals POUT and NOUT and stabilizing the output signal waveforms even in the state of being cut off from the supply voltage VDD and the reference voltage VSS by applying the bias voltage Vb from the bias voltage output circuits 10g.

INDUSTRIAL APPLICABILITY

A drive device according to the present invention is applicable as a drive device for driving piezoelectric speakers mounted on small electronic devices such as mobile telephones, personal digital assistance devices, portable music players, and the like.

DESCRIPTION OF REFERENCE NUMERALS

10: switching amplifier
10a: inverting amplifier circuit
10b: signal correction circuit
10c: PWM circuit
10d: gate driving control circuit (gate driver)
10f: switching drive circuit
10g: bias voltage output circuit
10h: low-pass filter circuit
10i: differential/single-ended conversion circuit

The invention claimed is:

1. A drive device for performing a pulse modulation of an input signal and outputting an output signal for driving a capacitive load; the drive device comprising:
  switching driver for including a charging switching element for charging the capacitive load and a short-circuiting switching element for short-circuiting between both terminals of the capacitive load to discharge the capacitive load, and operating the charging switching element and the short-circuiting switching element to output the output signal, the capacitive load being driven by a signal obtained by performing the pulse modulation of the input signal; and
  driving controller for controlling the switching driver based on the pulse-modulated input signal so as to repeatedly perform a charging phase that alternately repeats a phase charging the capacitive load and a phase not charging the capacitive load, and a discharging phase that alternately repeats a phase discharging the capacitive load by short-circuiting between both terminals of the capacitive load with the short-circuiting switching element and a phase not discharging the capacitive load,
  wherein the driving controller controls so as to change over from the charging phase to the discharging phase or from the discharging phase to the charging phase when a slope of the input signal changes.

2. The drive device according to claim 1, wherein the driving controller controls such that the discharging phase is changed to the charging phase either when the slope of the input signal is positive and the input signal reaches a first reference voltage, which is lower than an operation reference voltage of the input signal, or the slope of the input signal is negative and the input signal reaches a second reference voltage, which is higher than the operation reference voltage of the input signal.

3. The drive device according to claim 2, wherein
  the charging phase includes a first charging phase in which the capacitive load is charged from a positive terminal of the capacitive load and a second charging phase in which the capacitive load is charged from a negative terminal of the capacitive load,
  the discharging phase includes a first discharging phase in which the capacitive load is discharged from the positive terminal of the capacitive load and a second discharging phase in which the capacitive load is discharged from the negative terminal of the capacitive load, and wherein
  the driving controller controls change to the first charging phase, when the input signal reaches the first reference voltage in a positive slope of the input signal, controls change to the first discharging phase, when the slope of the input signal changes from positive to negative, controls change to the second charging phase, when the input signal reaches the second reference voltage in a negative slope of the input signal, and controls change to the second discharging phase, when the slope of the input signal changes from negative to positive.

4. The drive device according to claim 3, wherein the charging switching element comprises:
  a first switching element connected between the positive terminal of the capacitive load and the supply voltage;
  a second switching element connected between the positive terminal of the capacitive load and a reference voltage;
  a third switching element connected between the negative terminal of the capacitive load and the supply voltage; and
  a fourth switching element connected between the negative terminal of the capacitive load and the reference voltage, and
wherein the shorting switching element comprises:
  a fifth and a sixth switching element connected between both terminals of the capacitive load, and
  wherein the driving controller turns on the first and the fourth switching elements of the first to the sixth switching elements in the first charging phase, turns on the second and the third switching elements of the first to the sixth switching elements in the second charging phase, turns on the fifth and the sixth switching elements of the first to the sixth switching elements in the first and the second discharging phases, and turns off the first to the sixth switching elements in the phase not charging the capacitive load and in the phase not discharging the capacitive load.

5. The drive device according to any one of claims 1 to 4, wherein a bias voltage is applied to the output signal.

6. The drive device according to claim 5, wherein the bias voltage is lower than the supply voltage.

7. The drive device according to claim 6, wherein the bias voltage is approximately a half the supply voltage.

8. The drive device according to claim 5, wherein the bias voltage is applied at least in the discharging phase.

9. The drive device according to claim 5, further comprising a bias voltage output unit that applies the bias voltage to at least one of the terminals of the capacitive load.

10. The drive device according to claim 1, wherein the supply voltage is a direct-current supply voltage resulting from boosting and outputting a direct-current voltage.

11. The drive device according to claim 1, further comprising: a feedback unit comprising a low-pass filter circuit for removing high-frequency components of the output signal, a differential single-ended signal conversion circuit for converting the output signal output from the low-pass filter circuit from a differential signal type to a single-ended signal type, and a signal correction circuit for correcting an amplitude of the output signal based on an amplitude error between the output signal of the single-ended signal that is converted by the differential single-ended signal conversion circuit and the input signal; and a pulse modulation unit for performing the pulse modulation to the input signal based on a signal from the signal correction circuit.

12. The drive device according to claim 1, wherein the capacitive load is a piezoelectric speaker device.

13. A driving method of performing a pulse modulation of an input signal and driving a capacitive load, the driving method comprising:

repeatedly performing a charging phase that alternately repeats a phase charging the capacitive load and a phase not charging the capacitive load, the capacitive load being driven by a signal obtained by performing the pulse modulation of the input signal, and a discharging phase that alternately repeats a phase discharging the capacitive load by short-circuiting between both terminals of the capacitive load with a switching element and a phase not discharging the capacitive load, based on the input signal, and changing over from the charging phase to the discharging phase or from the discharging phase to the charging phase, when a slope of the input signal changes.

14. The driving method according to claim 13, further comprising changing from the discharging phase to the charging phase, when the slope of the input signal is positive and the input signal reaches a first reference voltage which is lower than an operation reference voltage of the input signal, and when slope of the input signal is negative and the input signal reaches a second reference voltage which is higher than the operation reference voltage of the input signal.

15. The driving method according to claim 14, wherein:

the charging phase includes a first charging phase in which the capacitive load is charged from a positive terminal of the capacitive load and a second charging phase in which the capacitive load is charged from a negative terminal of the capacitive load, the discharging phase includes a first discharging phase in which the capacitive load is discharged from the positive electrode of the capacitive load and a second discharging phase in which the capacitive load is discharged from the negative electrode of the capacitive load, change is made to the first charging phase, when the input signal reaches the first reference voltage in the positive slope of the input signal, change is made to the first discharging phase, when the slope of the input signal changes from positive to negative, change is made to the second charging phase, when the input signal reaches the second reference voltage in a negative slope of the input signal, and change is made to the second discharging phase, when the slope of the input signal changes from negative to positive.

16. The driving method according to any one of claims 13 to 15, wherein a bias voltage is applied to the output signal.

17. The driving method according to claim 13, wherein the capacitive load is a piezoelectric speaker device.

* * * * *